(12) United States Patent
Forbes et al.

(10) Patent No.: US 7,989,362 B2
(45) Date of Patent: *Aug. 2, 2011

(54) HAFNIUM LANTHANIDE OXYNITRIDE FILMS

(75) Inventors: Leonard Forbes, Corvallis, OR (US); Kie Y. Ahn, Chappaqua, NY (US); Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/505,963

(22) Filed: Jul. 20, 2009

(65) Prior Publication Data

US 2009/0294924 A1 Dec. 3, 2009

Related U.S. Application Data

(63) Continuation of application No. 11/515,143, filed on Aug. 31, 2006, now Pat. No. 7,563,730.

(51) Int. Cl.
*H01L 21/20* (2006.01)
*H01L 23/62* (2006.01)
*H01L 27/108* (2006.01)
*H01L 29/78* (2006.01)
*H01L 29/94* (2006.01)

(52) U.S. Cl. ........ 438/785; 438/591; 438/622; 438/641; 257/396; 257/405; 257/E21.013; 257/E21.021; 257/E21.168; 257/E21.171; 257/E21.197; 257/E21.209; 257/E21.396; 257/E27.087; 257/E29.302; 257/E21.274

(58) Field of Classification Search .................. 438/785, 438/591, 622, 641; 257/396, 405, E21.013, 257/E21.021, E21.168, E21.171, E21.197, 257/E21.209, E21.274, E21.396, E27.087, 257/E29.302

See application file for complete search history.

(56) References Cited

U.S. PATENT DOCUMENTS

| | | | |
|---|---|---|---|
| 2,501,563 | A | 3/1950 | Colbert et al. |
| 3,381,114 | A | 4/1968 | Nakanuma |
| 4,058,430 | A | 11/1977 | Suntola et al. |
| 4,215,156 | A | 7/1980 | Dalal et al. |
| 4,333,808 | A | 6/1982 | Bhattacharyya et al. |
| 4,399,424 | A | 8/1983 | Rigby |
| 4,413,022 | A | 11/1983 | Suntola et al. |
| 4,542,870 | A | 9/1985 | Howell |
| 4,590,042 | A | 5/1986 | Drage |
| 4,647,947 | A | 3/1987 | Takeoka et al. |
| 4,767,641 | A | 8/1988 | Kieser et al. |

(Continued)

FOREIGN PATENT DOCUMENTS

EP 0540993 A1 5/1993

(Continued)

OTHER PUBLICATIONS

Alen, Petra, "Atomic Layer Deposition of TaN, NbN, and MoN Films for Cu Metallizations", *University of Helsinki Academic Dissertation*, Laboratory of Inorganic Chemistry, Department of Chemistry, University of Helsinki, Finland, (2005), 72 pgs.

(Continued)

*Primary Examiner* — David A Zarneke
(74) *Attorney, Agent, or Firm* — Schwegman, Lundberg & Woessner, P.A.

(57) ABSTRACT

Electronic apparatus and methods of forming the electronic apparatus include a hafnium lanthanide oxynitride film on a substrate for use in a variety of electronic systems. The hafnium lanthanide oxynitride film may be structured as one or more monolayers. Metal electrodes may be disposed on a dielectric containing a hafnium lanthanide oxynitride film.

24 Claims, 12 Drawing Sheets

U.S. PATENT DOCUMENTS

| | | |
|---|---|---|
| 4,920,071 A | 4/1990 | Thomas |
| 4,993,358 A | 2/1991 | Mahawili |
| 5,006,192 A | 4/1991 | Deguchi |
| 5,055,319 A | 10/1991 | Bunshah et al. |
| 5,252,370 A | 10/1993 | Tominaga et al. |
| 5,334,433 A | 8/1994 | Tominaga |
| 5,364,708 A | 11/1994 | Tominaga |
| 5,401,609 A | 3/1995 | Haratani et al. |
| 5,406,546 A | 4/1995 | Uchiyama et al. |
| 5,418,030 A | 5/1995 | Tominaga et al. |
| 5,430,706 A | 7/1995 | Utsunomiya et al. |
| 5,470,628 A | 11/1995 | Tominaga et al. |
| 5,498,507 A | 3/1996 | Handa et al. |
| 5,523,140 A | 6/1996 | Tominaga et al. |
| 5,552,237 A | 9/1996 | Utsunomiya et al. |
| 5,569,517 A | 10/1996 | Tominaga et al. |
| 5,577,020 A | 11/1996 | Utsunomiya et al. |
| 5,587,609 A | 12/1996 | Murakami et al. |
| 5,593,789 A | 1/1997 | Utsunomiya et al. |
| 5,595,606 A | 1/1997 | Fujikawa et al. |
| 5,620,766 A | 4/1997 | Uchiyama et al. |
| 5,627,012 A | 5/1997 | Tominaga et al. |
| 5,637,371 A | 6/1997 | Tominaga et al. |
| 5,637,372 A | 6/1997 | Tominaga et al. |
| 5,698,022 A | 12/1997 | Glassman et al. |
| 5,700,567 A | 12/1997 | Utsunomiya |
| 5,735,960 A | 4/1998 | Sandhu et al. |
| 5,765,214 A | 6/1998 | Sywyk |
| 5,795,808 A | 8/1998 | Park |
| 5,801,105 A | 9/1998 | Yano et al. |
| 5,810,923 A | 9/1998 | Yano et al. |
| 5,822,256 A | 10/1998 | Bauer et al. |
| 5,825,046 A | 10/1998 | Czubatyj et al. |
| 5,828,080 A | 10/1998 | Yano et al. |
| 5,840,897 A | 11/1998 | Kirlin et al. |
| 5,891,542 A | 4/1999 | Tominaga et al. |
| 5,906,874 A | 5/1999 | Takahashi et al. |
| 5,912,797 A | 6/1999 | Schneemeyer et al. |
| 5,950,925 A | 9/1999 | Fukunaga et al. |
| 5,965,323 A | 10/1999 | Takahashi et al. |
| 5,981,014 A | 11/1999 | Tsukagoshi et al. |
| 6,002,418 A | 12/1999 | Yoneda et al. |
| 6,013,553 A | 1/2000 | Wallace et al. |
| 6,020,024 A | 2/2000 | Maiti et al. |
| 6,020,243 A | 2/2000 | Wallace et al. |
| 6,027,961 A | 2/2000 | Maiti et al. |
| 6,030,679 A | 2/2000 | Saito et al. |
| 6,040,030 A | 3/2000 | Utsunomiya et al. |
| 6,051,363 A | 4/2000 | Utsunomiya et al. |
| 6,057,271 A | 5/2000 | Kenjiro et al. |
| 6,059,885 A | 5/2000 | Ohashi et al. |
| 6,061,077 A | 5/2000 | Kashiwaya et al. |
| 6,081,287 A | 6/2000 | Noshita et al. |
| 6,087,067 A | 7/2000 | Kato et al. |
| 6,087,674 A | 7/2000 | Ovshinsky et al. |
| 6,103,330 A | 8/2000 | Kosuda et al. |
| 6,110,529 A | 8/2000 | Gardiner et al. |
| 6,136,168 A | 10/2000 | Masujima et al. |
| 6,137,520 A | 10/2000 | Kashiwaya et al. |
| 6,153,355 A | 11/2000 | Takahashi et al. |
| 6,161,500 A | 12/2000 | Kopacz et al. |
| 6,171,900 B1 | 1/2001 | Sun |
| 6,175,377 B1 | 1/2001 | Noshita et al. |
| 6,200,893 B1 | 3/2001 | Sneh |
| 6,203,613 B1 | 3/2001 | Gates et al. |
| 6,206,972 B1 | 3/2001 | Dunham |
| 6,207,589 B1 | 3/2001 | Ma et al. |
| 6,211,035 B1 | 4/2001 | Moise et al. |
| 6,225,168 B1 | 5/2001 | Gardner et al. |
| 6,242,157 B1 | 6/2001 | Tominaga et al. |
| 6,243,941 B1 | 6/2001 | Kashiwaya et al. |
| 6,256,052 B1 | 7/2001 | Yoneda |
| 6,256,053 B1 | 7/2001 | Noshita et al. |
| 6,281,144 B1 | 8/2001 | Cleary et al. |
| 6,291,866 B1 | 9/2001 | Wallace et al. |
| 6,297,539 B1 | 10/2001 | Ma et al. |
| 6,302,964 B1 | 10/2001 | Umotoy et al. |
| 6,303,481 B2 | 10/2001 | Park |
| 6,316,054 B1 | 11/2001 | Kashiwaya et al. |
| 6,329,036 B1 | 12/2001 | Kikukawa et al. |
| 6,337,704 B1 | 1/2002 | Yamaguchi |
| 6,348,386 B1 | 2/2002 | Gilmer |
| 6,351,276 B1 | 2/2002 | Yamaguchi |
| 6,358,766 B1 | 3/2002 | Kasahara |
| 6,368,941 B1 | 4/2002 | Chen et al. |
| 6,380,579 B1 | 4/2002 | Nam et al. |
| 6,387,712 B1 | 5/2002 | Yano et al. |
| 6,391,769 B1 | 5/2002 | Lee et al. |
| 6,406,772 B2 | 6/2002 | Tominaga et al. |
| 6,410,368 B1 | 6/2002 | Kawasaki et al. |
| 6,420,279 B1 | 7/2002 | Ono et al. |
| 6,426,245 B1 | 7/2002 | Kawasaki et al. |
| 6,432,779 B1 | 8/2002 | Hobbs et al. |
| 6,441,417 B1 | 8/2002 | Zhang et al. |
| 6,444,039 B1 | 9/2002 | Nguyen |
| 6,444,592 B1 | 9/2002 | Ballantine et al. |
| 6,445,023 B1 | 9/2002 | Vaartstra et al. |
| 6,448,192 B1 | 9/2002 | Kaushik |
| 6,451,641 B1 | 9/2002 | Halliyal et al. |
| 6,451,695 B2 | 9/2002 | Sneh |
| 6,458,701 B1 | 10/2002 | Chae et al. |
| 6,461,710 B1 | 10/2002 | Kikukawa et al. |
| 6,465,334 B1 | 10/2002 | Buynoski et al. |
| 6,482,740 B2 | 11/2002 | Soininen et al. |
| 6,492,659 B1 | 12/2002 | Yamazaki et al. |
| 6,495,436 B2 | 12/2002 | Ahn et al. |
| 6,495,449 B1 | 12/2002 | Nguyen |
| 6,509,280 B2 | 1/2003 | Choi |
| 6,514,828 B2 | 2/2003 | Ahn et al. |
| 6,521,911 B2 | 2/2003 | Parsons et al. |
| 6,531,354 B2 | 3/2003 | Maria et al. |
| 6,534,420 B2 | 3/2003 | Ahn et al. |
| 6,537,613 B1 | 3/2003 | Senzaki et al. |
| 6,537,721 B2 | 3/2003 | Inoue et al. |
| 6,544,875 B1 | 4/2003 | Wilk |
| 6,555,875 B2 | 4/2003 | Kawasaki et al. |
| 6,555,879 B1 | 4/2003 | Krivokapic et al. |
| 6,558,563 B2 | 5/2003 | Kashiwaya et al. |
| 6,586,349 B1 | 7/2003 | Jeon et al. |
| 6,590,252 B2 | 7/2003 | Kutsunai et al. |
| 6,599,788 B1 | 7/2003 | Kawasaki et al. |
| 6,613,695 B2 | 9/2003 | Pomarede et al. |
| 6,617,639 B1 | 9/2003 | Wang et al. |
| 6,624,013 B2 | 9/2003 | Kawasaki et al. |
| 6,627,503 B2 | 9/2003 | Ma et al. |
| 6,645,882 B1 | 11/2003 | Halliyal et al. |
| 6,653,657 B2 | 11/2003 | Kawasaki et al. |
| 6,660,660 B2 | 12/2003 | Haukka et al. |
| 6,673,701 B1 | 1/2004 | Marsh et al. |
| 6,688,951 B2 | 2/2004 | Kashiwaya et al. |
| 6,696,332 B2 | 2/2004 | Visokay et al. |
| 6,713,846 B1 | 3/2004 | Senzaki |
| 6,730,163 B2 | 5/2004 | Vaartstra |
| 6,730,164 B2 | 5/2004 | Vaartstra et al. |
| 6,731,590 B1 | 5/2004 | Shingai et al. |
| 6,740,605 B1 | 5/2004 | Shiraiwa et al. |
| 6,748,959 B1 | 6/2004 | Kashiwaya et al. |
| 6,750,126 B1 | 6/2004 | Visokay et al. |
| 6,753,567 B2 | 6/2004 | Maria et al. |
| 6,754,108 B2 | 6/2004 | Forbes |
| 6,762,081 B2 | 7/2004 | Yamazaki et al. |
| 6,762,114 B1 | 7/2004 | Chambers |
| 6,767,582 B1 | 7/2004 | Elers |
| 6,767,795 B2 | 7/2004 | Ahn et al. |
| 6,770,923 B2 | 8/2004 | Nguyen et al. |
| 6,778,441 B2 | 8/2004 | Forbes et al. |
| 6,784,049 B2 | 8/2004 | Vaartstra |
| 6,784,101 B1 | 8/2004 | Yu et al. |
| 6,787,370 B2 | 9/2004 | Forbes |
| 6,794,284 B2 | 9/2004 | Vaartstra |
| 6,804,136 B2 | 10/2004 | Forbes |
| 6,809,370 B1 | 10/2004 | Colombo et al. |
| 6,812,517 B2 | 11/2004 | Baker |
| 6,844,203 B2 | 1/2005 | Ahn et al. |
| 6,844,249 B2 | 1/2005 | Kawasaki et al. |
| 6,852,645 B2 | 2/2005 | Colombo et al. |
| 6,858,444 B2 | 2/2005 | Ahn et al. |

| | | |
|---|---|---|
| 6,863,725 B2 | 3/2005 | Vaartstra et al. |
| 6,888,739 B2 | 5/2005 | Forbes |
| 6,893,984 B2 | 5/2005 | Ahn et al. |
| 6,900,122 B2 | 5/2005 | Ahn et al. |
| 6,909,156 B2 | 6/2005 | Aoyama |
| 6,914,800 B2 | 7/2005 | Ahn et al. |
| 6,916,398 B2 | 7/2005 | Chen et al. |
| 6,921,702 B2 | 7/2005 | Ahn et al. |
| 6,929,840 B2 | 8/2005 | Hosoda et al. |
| 6,930,346 B2 | 8/2005 | Ahn et al. |
| 6,936,508 B2 | 8/2005 | Visokay et al. |
| 6,953,730 B2 | 10/2005 | Ahn et al. |
| 6,958,300 B2 | 10/2005 | Vaartstra et al. |
| 6,958,302 B2 | 10/2005 | Ahn et al. |
| 6,960,538 B2 | 11/2005 | Ahn et al. |
| 6,967,159 B2 | 11/2005 | Vaartstra |
| 6,979,623 B2 | 12/2005 | Rotondaro et al. |
| 6,979,855 B2 | 12/2005 | Ahn et al. |
| 6,984,592 B2 | 1/2006 | Vaartstra |
| 6,989,573 B2 | 1/2006 | Ahn et al. |
| 6,995,081 B2 | 2/2006 | Vaartstra |
| 7,012,311 B2 | 3/2006 | Ohmi et al. |
| 7,014,903 B2 | 3/2006 | Takasaki et al. |
| 7,015,534 B2 | 3/2006 | Colombo |
| 7,018,694 B2 | 3/2006 | Hosoda et al. |
| 7,018,695 B2 | 3/2006 | Kakiuchi et al. |
| 7,019,351 B2 | 3/2006 | Eppich et al. |
| 7,026,694 B2 | 4/2006 | Ahn et al. |
| 7,030,042 B2 | 4/2006 | Vaartstra et al. |
| 7,037,862 B2 | 5/2006 | Ahn et al. |
| 7,041,609 B2 | 5/2006 | Vaartstra |
| 7,045,430 B2 | 5/2006 | Ahn et al. |
| 7,045,431 B2 | 5/2006 | Rotondaro et al. |
| 7,049,192 B2 | 5/2006 | Ahn et al. |
| 7,068,544 B2 | 6/2006 | Forbes et al. |
| 7,077,902 B2 | 7/2006 | Vaartstra |
| 7,081,421 B2 | 7/2006 | Ahn et al. |
| 7,084,078 B2 | 8/2006 | Ahn et al. |
| 7,087,481 B2 | 8/2006 | Vaartstra et al. |
| 7,091,119 B2 | 8/2006 | Colombo |
| 7,101,813 B2 | 9/2006 | Ahn et al. |
| 7,112,485 B2 | 9/2006 | Vaartstra |
| 7,115,166 B2 | 10/2006 | Vaartstra et al. |
| 7,115,528 B2 | 10/2006 | Vaartstra et al. |
| 7,115,530 B2 | 10/2006 | Quevedo-Lopez et al. |
| 7,122,409 B2 | 10/2006 | Kawasaki et al. |
| 7,122,464 B2 | 10/2006 | Vaartstra |
| 7,125,815 B2 | 10/2006 | Vaartstra |
| 7,135,361 B2 | 11/2006 | Visokay et al. |
| 7,135,369 B2 | 11/2006 | Ahn et al. |
| 7,135,370 B2 | 11/2006 | Baker |
| 7,135,421 B2 | 11/2006 | Ahn et al. |
| 7,136,343 B2 | 11/2006 | Inoue et al. |
| 7,141,288 B2 | 11/2006 | Inoue et al. |
| 7,141,289 B2 | 11/2006 | Inoue et al. |
| 7,144,825 B2 | 12/2006 | Adetutu et al. |
| 7,148,546 B2 | 12/2006 | Visokay et al. |
| 7,154,836 B2 | 12/2006 | Inoue et al. |
| 7,157,128 B2 | 1/2007 | Inoue et al. |
| 7,160,577 B2 | 1/2007 | Ahn et al. |
| 7,160,597 B2 | 1/2007 | Inoue et al. |
| 7,161,894 B2 | 1/2007 | Judge |
| 7,166,347 B2 | 1/2007 | Inoue et al. |
| 7,167,440 B2 | 1/2007 | Inoue et al. |
| 7,176,076 B2 | 2/2007 | Chambers et al. |
| 7,182,990 B2 | 2/2007 | Inoue et al. |
| 7,195,999 B2 | 3/2007 | Forbes et al. |
| 7,196,007 B2 | 3/2007 | Vaartstra |
| 7,199,023 B2 | 4/2007 | Ahn et al. |
| 7,208,793 B2 | 4/2007 | Bhattacharyya |
| 7,214,416 B2 | 5/2007 | Nakai et al. |
| 7,226,830 B2 | 6/2007 | Colombo et al. |
| 7,235,501 B2 | 6/2007 | Ahn et al. |
| 7,241,686 B2 | 7/2007 | Marcadal et al. |
| 7,250,367 B2 | 7/2007 | Vaartstra et al. |
| 7,253,122 B2 | 8/2007 | Vaartstra |
| 7,271,077 B2 | 9/2007 | Vaartstra et al. |
| 7,291,526 B2 | 11/2007 | Li |
| 7,294,556 B2 | 11/2007 | Vaartstra |
| 7,300,870 B2 | 11/2007 | Vaartstra |
| 7,332,442 B2 | 2/2008 | Vaartstra et al. |
| 7,368,402 B2 | 5/2008 | Vaartstra |
| 7,374,617 B2 | 5/2008 | Vaartstra |
| 7,396,719 B2 | 7/2008 | Kim et al. |
| 7,410,918 B2 | 8/2008 | Vaarstra |
| 7,498,247 B2 | 3/2009 | Ahn et al. |
| 7,582,161 B2 | 9/2009 | Ahn et al. |
| 7,582,549 B2 | 9/2009 | Ahn et al. |
| 7,588,988 B2 | 9/2009 | Ahn et al. |
| 7,602,030 B2 | 10/2009 | Ahn et al. |
| 7,605,030 B2 | 10/2009 | Forbes et al. |
| 7,615,438 B2 | 11/2009 | Ahn et al. |
| 7,662,729 B2 | 2/2010 | Ahn et al. |
| 7,687,409 B2 | 3/2010 | Ahn et al. |
| 7,727,908 B2 | 6/2010 | Ahn et al. |
| 7,759,747 B2 | 7/2010 | Forbes et al. |
| 7,776,765 B2 | 8/2010 | Forbes et al. |
| 2001/0009695 A1 | 7/2001 | Saanila et al. |
| 2001/0015441 A1 | 8/2001 | Kawasaki et al. |
| 2001/0031332 A1 | 10/2001 | Tominaga et al. |
| 2001/0032995 A1 | 10/2001 | Maria et al. |
| 2001/0054598 A1 | 12/2001 | Kashiwaya et al. |
| 2002/0001971 A1 | 1/2002 | Cho |
| 2002/0089023 A1 | 7/2002 | Yu et al. |
| 2002/0094632 A1 | 7/2002 | Agarwal et al. |
| 2002/0121665 A1 | 9/2002 | Kawasaki et al. |
| 2002/0142536 A1 | 10/2002 | Zhang et al. |
| 2002/0146874 A1 | 10/2002 | Kawasaki et al. |
| 2002/0146916 A1 | 10/2002 | Irino et al. |
| 2002/0155688 A1 | 10/2002 | Ahn |
| 2002/0155689 A1 | 10/2002 | Ahn |
| 2002/0192974 A1 | 12/2002 | Ahn et al. |
| 2003/0008235 A1 | 1/2003 | Inoue et al. |
| 2003/0016619 A1 | 1/2003 | Judge et al. |
| 2003/0017717 A1 | 1/2003 | Ahn |
| 2003/0043637 A1 | 3/2003 | Forbes et al. |
| 2003/0045078 A1 | 3/2003 | Ahn et al. |
| 2003/0048666 A1 | 3/2003 | Eldridge et al. |
| 2003/0060146 A1 | 3/2003 | Kashiwaya et al. |
| 2003/0092213 A1 | 5/2003 | Yamazaki et al. |
| 2003/0111678 A1 | 6/2003 | Colombo et al. |
| 2003/0137019 A1 | 7/2003 | Maria et al. |
| 2003/0176065 A1 | 9/2003 | Vaartstra |
| 2003/0193061 A1 | 10/2003 | Osten |
| 2003/0200917 A1 | 10/2003 | Vaartstra |
| 2003/0207032 A1 | 11/2003 | Ahn et al. |
| 2003/0207540 A1 | 11/2003 | Ahn et al. |
| 2003/0207593 A1 | 11/2003 | Derderian et al. |
| 2003/0227033 A1 | 12/2003 | Ahn et al. |
| 2003/0228747 A1 | 12/2003 | Ahn et al. |
| 2003/0235134 A1 | 12/2003 | Inoue et al. |
| 2004/0004859 A1 | 1/2004 | Forbes |
| 2004/0027966 A1 | 2/2004 | Inoue et al. |
| 2004/0032812 A1 | 2/2004 | Inoue et al. |
| 2004/0038525 A1 | 2/2004 | Meng et al. |
| 2004/0040494 A1 | 3/2004 | Vaartstra et al. |
| 2004/0040501 A1 | 3/2004 | Vaartstra |
| 2004/0041192 A1 | 3/2004 | Baker |
| 2004/0043151 A1 | 3/2004 | Vaartstra |
| 2004/0043541 A1 | 3/2004 | Ahn et al. |
| 2004/0043569 A1 | 3/2004 | Ahn et al. |
| 2004/0043600 A1 | 3/2004 | Vaartstra |
| 2004/0043604 A1 | 3/2004 | Vaartstra |
| 2004/0043625 A1 | 3/2004 | Vaartstra et al. |
| 2004/0043630 A1 | 3/2004 | Vaartstra et al. |
| 2004/0043632 A1 | 3/2004 | Vaartstra |
| 2004/0043633 A1 | 3/2004 | Vaartstra |
| 2004/0043634 A1 | 3/2004 | Vaartstra |
| 2004/0043635 A1 | 3/2004 | Vaartstra |
| 2004/0043636 A1 | 3/2004 | Vaartstra et al. |
| 2004/0092061 A1 | 5/2004 | Kawasaki et al. |
| 2004/0110391 A1 | 6/2004 | Ahn et al. |
| 2004/0126944 A1 | 7/2004 | Pacheco Rotondaro et al. |
| 2004/0126954 A1 | 7/2004 | Vaartstra et al. |
| 2004/0127003 A1 | 7/2004 | Chambers |
| 2004/0140470 A1 | 7/2004 | Kawasaki et al. |
| 2004/0144980 A1 | 7/2004 | Ahn et al. |
| 2004/0146805 A1 | 7/2004 | Kato et al. |

| | | | | | | |
|---|---|---|---|---|---|---|
| 2004/0152254 A1 | 8/2004 | Vaartstra et al. | | 2005/0260357 A1 | 11/2005 | Olsen et al. |
| 2004/0157158 A1 | 8/2004 | Kakiuchi et al. | | 2005/0263756 A1 | 12/2005 | Yatsunami et al. |
| 2004/0159863 A1 | 8/2004 | Eldridge et al. | | 2005/0270963 A1 | 12/2005 | Mishima et al. |
| 2004/0161883 A1 | 8/2004 | Colombo et al. | | 2005/0271812 A1 | 12/2005 | Myo et al. |
| 2004/0174804 A1 | 9/2004 | Kakiuchi et al. | | 2005/0271813 A1 | 12/2005 | Kher et al. |
| 2004/0175882 A1 | 9/2004 | Ahn et al. | | 2005/0282329 A1 | 12/2005 | Li |
| 2004/0180171 A1 | 9/2004 | Takasaki et al. | | 2005/0285225 A1 | 12/2005 | Ahn et al. |
| 2004/0187968 A1 | 9/2004 | Vaartstra | | 2005/0285226 A1 | 12/2005 | Lee |
| 2004/0188778 A1 | 9/2004 | Aoyama | | 2005/0287804 A1 | 12/2005 | Vaartstra |
| 2004/0190435 A1 | 9/2004 | Hosoda et al. | | 2005/0287819 A1 | 12/2005 | Vaartstra et al. |
| 2004/0191462 A1 | 9/2004 | Hosoda et al. | | 2006/0003529 A1 | 1/2006 | Baker |
| 2004/0191685 A1 | 9/2004 | Kakiuchi et al. | | 2006/0019033 A1 | 1/2006 | Muthukrishnan et al. |
| 2004/0191687 A1 | 9/2004 | Fukuzawa et al. | | 2006/0024975 A1 | 2/2006 | Ahn et al. |
| 2004/0191689 A1 | 9/2004 | Shingai et al. | | 2006/0027882 A1 | 2/2006 | Mokhlesi |
| 2004/0197946 A1 | 10/2004 | Vaartstra et al. | | 2006/0043367 A1 | 3/2006 | Chang et al. |
| 2004/0208105 A1 | 10/2004 | Shingai et al. | | 2006/0043504 A1 | 3/2006 | Ahn et al. |
| 2004/0213124 A1 | 10/2004 | Shingai et al. | | 2006/0046521 A1 | 3/2006 | Vaartstra et al. |
| 2004/0214399 A1 | 10/2004 | Ahn et al. | | 2006/0046522 A1 | 3/2006 | Ahn et al. |
| 2004/0219746 A1 | 11/2004 | Vaartstra et al. | | 2006/0048711 A1 | 3/2006 | Vaartstra |
| 2004/0233010 A1 | 11/2004 | Akram et al. | | 2006/0062917 A1 | 3/2006 | Muthukrishnan et al. |
| 2004/0238904 A1 | 12/2004 | Colombo et al. | | 2006/0084247 A1 | 4/2006 | Liu |
| 2004/0241581 A1 | 12/2004 | Kakiuchi et al. | | 2006/0110870 A1 | 5/2006 | Bhattacharyya |
| 2004/0248387 A1 | 12/2004 | Kawasaki et al. | | 2006/0118890 A1 | 6/2006 | Li |
| 2004/0262700 A1 | 12/2004 | Ahn et al. | | 2006/0121744 A1 | 6/2006 | Quevedo-Lopez et al. |
| 2005/0009266 A1 | 1/2005 | Vaartstra | | 2006/0125030 A1 | 6/2006 | Ahn et al. |
| 2005/0009358 A1 | 1/2005 | Choi et al. | | 2006/0128168 A1 | 6/2006 | Ahn et al. |
| 2005/0009368 A1 | 1/2005 | Vaartstra | | 2006/0148180 A1 | 7/2006 | Ahn et al. |
| 2005/0018590 A1 | 1/2005 | Inoue et al. | | 2006/0153051 A1 | 7/2006 | Kikukawa et al. |
| 2005/0018591 A1 | 1/2005 | Inoue et al. | | 2006/0161942 A1 | 7/2006 | Kikukawa et al. |
| 2005/0018592 A1 | 1/2005 | Inoue et al. | | 2006/0166476 A1 | 7/2006 | Lee et al. |
| 2005/0019978 A1 | 1/2005 | Vaartstra et al. | | 2006/0172485 A1 | 8/2006 | Vaartstra |
| 2005/0020017 A1 | 1/2005 | Ahn et al. | | 2006/0176645 A1 | 8/2006 | Ahn et al. |
| 2005/0023574 A1 | 2/2005 | Forbes et al. | | 2006/0177975 A1 | 8/2006 | Ahn et al. |
| 2005/0023594 A1 | 2/2005 | Ahn et al. | | 2006/0183272 A1 | 8/2006 | Ahn et al. |
| 2005/0023595 A1 | 2/2005 | Forbes et al. | | 2006/0186458 A1 | 8/2006 | Forbes et al. |
| 2005/0023602 A1 | 2/2005 | Forbes et al. | | 2006/0189154 A1 | 8/2006 | Ahn et al. |
| 2005/0023603 A1 | 2/2005 | Eldridge et al. | | 2006/0205132 A1 | 9/2006 | Bhattacharyya |
| 2005/0023624 A1 | 2/2005 | Ahn et al. | | 2006/0223248 A1 | 10/2006 | Venugopal et al. |
| 2005/0026349 A1 | 2/2005 | Forbes et al. | | 2006/0223337 A1 | 10/2006 | Ahn et al. |
| 2005/0028733 A1 | 2/2005 | Vaartstra | | 2006/0228868 A1 | 10/2006 | Ahn et al. |
| 2005/0032360 A1 | 2/2005 | Vaartstra | | 2006/0231017 A1 | 10/2006 | Vaartstra |
| 2005/0047301 A1 | 3/2005 | Inoue et al. | | 2006/0244045 A1 | 11/2006 | Visokay et al. |
| 2005/0047302 A1 | 3/2005 | Inoue et al. | | 2006/0244082 A1 | 11/2006 | Ahn et al. |
| 2005/0047303 A1 | 3/2005 | Inoue et al. | | 2006/0244100 A1 | 11/2006 | Ahn et al. |
| 2005/0047304 A1 | 3/2005 | Inoue et al. | | 2006/0245339 A1 | 11/2006 | Fukuzawa et al. |
| 2005/0047305 A1 | 3/2005 | Inoue et al. | | 2006/0246647 A1 | 11/2006 | Visokay et al. |
| 2005/0047306 A1 | 3/2005 | Inoue et al. | | 2006/0246651 A1 | 11/2006 | Chambers et al. |
| 2005/0048249 A1 | 3/2005 | Inoue et al. | | 2006/0246716 A1 | 11/2006 | Colombo et al. |
| 2005/0054165 A1 | 3/2005 | Ahn et al. | | 2006/0252244 A1 | 11/2006 | Vaartstra et al. |
| 2005/0059198 A1 | 3/2005 | Visokay et al. | | 2006/0252279 A1 | 11/2006 | Vaartstra |
| 2005/0070062 A1 | 3/2005 | Visokay et al. | | 2006/0258175 A1 | 11/2006 | Vaartstra et al. |
| 2005/0077519 A1 | 4/2005 | Ahn et al. | | 2006/0261389 A1 | 11/2006 | Vaartstra |
| 2005/0079696 A1 | 4/2005 | Colombo | | 2006/0270147 A1 | 11/2006 | Ahn et al. |
| 2005/0085092 A1 | 4/2005 | Adetutu et al. | | 2006/0275577 A1 | 12/2006 | Nakai et al. |
| 2005/0106797 A1 | 5/2005 | Colombo | | 2006/0278940 A1 | 12/2006 | Kato et al. |
| 2005/0112499 A1 | 5/2005 | Nakai et al. | | 2006/0280895 A1 | 12/2006 | Kikukawa et al. |
| 2005/0124109 A1 | 6/2005 | Quevedo-Lopez et al. | | 2006/0280896 A1 | 12/2006 | Kikukawa et al. |
| 2005/0124171 A1 | 6/2005 | Vaartstra | | 2006/0281330 A1 | 12/2006 | Ahn et al. |
| 2005/0124174 A1 | 6/2005 | Ahn et al. | | 2006/0289863 A1 | 12/2006 | Iijima et al. |
| 2005/0130442 A1 | 6/2005 | Visokay et al. | | 2006/0289895 A1 | 12/2006 | Kamata |
| 2005/0136589 A1 | 6/2005 | Rotondaro et al. | | 2006/0292773 A1 | 12/2006 | Goolsby et al. |
| 2005/0136632 A1 | 6/2005 | Rotondaro et al. | | 2006/0292788 A1 | 12/2006 | Vaartstra |
| 2005/0136689 A9 | 6/2005 | Vaartstra | | 2007/0006798 A1 | 1/2007 | Vaartstra et al. |
| 2005/0138262 A1 | 6/2005 | Forbes | | 2007/0007560 A1 | 1/2007 | Forbes et al. |
| 2005/0140462 A1 | 6/2005 | Akram et al. | | 2007/0007635 A1 | 1/2007 | Forbes et al. |
| 2005/0142324 A1 | 6/2005 | Hayashida et al. | | 2007/0010060 A1 | 1/2007 | Forbes et al. |
| 2005/0145957 A1 | 7/2005 | Ahn et al. | | 2007/0027882 A1 | 2/2007 | Kulkarni |
| 2005/0158973 A1 | 7/2005 | Ahn et al. | | 2007/0030795 A1 | 2/2007 | Kikuawa et al. |
| 2005/0160981 A9 | 7/2005 | Vaartstra et al. | | 2007/0037335 A1 | 2/2007 | Chambers et al. |
| 2005/0164521 A1 | 7/2005 | Ahn et al. | | 2007/0059872 A1 | 3/2007 | Visokay et al. |
| 2005/0170208 A1 | 8/2005 | Yatsunami et al. | | 2007/0069241 A1 | 3/2007 | Yang et al. |
| 2005/0181607 A1 | 8/2005 | Aoyama | | 2007/0072364 A1 | 3/2007 | Visokay et al. |
| 2005/0207308 A1 | 9/2005 | Kobayashi et al. | | 2007/0090440 A1 | 4/2007 | Ahn et al. |
| 2005/0217722 A1 | 10/2005 | Komatsu et al. | | 2007/0144438 A1 | 6/2007 | Vaartstra |
| 2005/0218462 A1 | 10/2005 | Ahn et al. | | 2007/0145454 A1 | 6/2007 | Bhattacharyya |
| 2005/0221006 A1 | 10/2005 | Vaartstra | | 2007/0155190 A1 | 7/2007 | Vaartstra et al. |
| 2005/0233247 A1 | 10/2005 | Hosoda et al. | | 2007/0161260 A1 | 7/2007 | Vaartstra |
| 2005/0243677 A1 | 11/2005 | Kobayashi et al. | | 2007/0166999 A1 | 7/2007 | Vaartstra |
| 2005/0260347 A1 | 11/2005 | Narwankar et al. | | 2007/0181931 A1 | 8/2007 | Ahn et al. |

| | | | |
|---|---|---|---|
| 2007/0187831 A1 | 8/2007 | Ahn et al. | |
| 2007/0234949 A1 | 10/2007 | Ahn et al. | |
| 2007/0295273 A1 | 12/2007 | Vaartstra | |
| 2008/0032465 A1 | 2/2008 | Ahn et al. | |
| 2008/0054330 A1 | 3/2008 | Forbes et al. | |
| 2008/0057659 A1 | 3/2008 | Forbes | |
| 2008/0057690 A1 | 3/2008 | Forbes | |
| 2008/0064210 A1 | 3/2008 | Vaartstra | |
| 2008/0102629 A1 | 5/2008 | Vaartstra | |
| 2009/0166748 A1 | 7/2009 | Takahashi | |
| 2009/0236650 A1 | 9/2009 | Forbes et al. | |
| 2010/0029054 A1 | 2/2010 | Ahn et al. | |
| 2010/0041244 A1 | 2/2010 | Forbes et al. | |

FOREIGN PATENT DOCUMENTS

| | | |
|---|---|---|
| EP | 1096042 A1 | 5/2001 |
| EP | 1124262 A2 | 8/2001 |
| JP | 62-199019 | 9/1987 |
| JP | 5090169 | 4/1993 |
| JP | 2001-332546 | 11/2001 |
| WO | WO-01/97257 | 12/2001 |
| WO | WO-0231875 A2 | 4/2002 |
| WO | WO-02/43115 | 5/2002 |

OTHER PUBLICATIONS

Alen, Petra, et al., "tert-Butylamine and allylamine as reductive nitrogen sources in atomic layer deposition of TaN thin films", *Journal of Materials Research*, 17(1), (Jan. 2002), 107-114.

"International Technology Roadmap for Semiconductors, 2001 Edition", Retrieved from http://public.itrs.net/Files/2001ITRS/Home.html, Organized by International SEMATECH, (2001), 469 pages.

Aarik, Jaan, "Influence of substrate temperature on atomic layer growth and properties of $HfO_2$ thin films", *Thin Solid Films*, 340(1-2), (1999), 110-116.

Aarik, Jaan, "Phase transformations in hafnium dioxide thin films grown by atomic layer deposition at high temperatures", *Applied Surface Science*, 173(1-2), (Mar. 2001), 15-21.

Aarik, Jaan, "Texture development in nanocrystalline hafnium dioxide thin films grown by atomic layer deposition", *Journal of Crystal Growth*, 220(1-2), (Nov. 15, 2000), 105-113.

Bendoraitis, J G, et al., "Optical energy gaps in the monoclinic oxides of hafnium zirconium and their solid solutions", *Journal of Physical Chemistry*, 69(10), (1965), 3666-3667.

Callegari, A., et al., "Physical and electrical characterization of Hafnium oxide and Hafnium silicate sputtered films", *Journal of Applied Physics*, 90(12), (Dec. 15, 2001), 6466-75.

Chin, Albert, et al., "Device and reliability of high-K Al O gate dielectric. with good mobility and low D", *1999 Symposium on VLSI Technology Digest of Technical Papers*, (1999), 135-136.

Cho, H.-J., et al., "Novel nitrogen profile engineering for improved TaN $HfO_2$ Si MOSFET performance", *International Electron Devices Meeting*, (2001/1998), 655-658.

Degrave, R, "Temperature Acceleration of oxide breakdown and its impact on ultra-thin gate oxide reliaility", *1999 Symposium on VLSI Technology Digest of Technical Papers*, (1999), 59-60.

Forsgren, Katarina, "CVD and ALD of Group IV- and V-Oxides for Dielectric Applications", *Comprehensive Summaries of Uppsala Dissertation from the Faculty of Science and Technology*, 665, (2001).

Horwitz, JS S, et al., "Pulsed laser deposition as a materials research tool", *Applied Surface Science*, 127-29, (1998), 507-513.

Jeon, T. S., "Thermal Stabilitiy of ultrathin $ZrO_2$ films prpared by chemical vapor deposition of Si(100)", *Appl. Phys. Lett.*, 78(3), (Jan. 15, 2001), 368-370.

Jeong, Chang-Wook, "Plasma-Assisted Atomic Layer Growth of High-Quality Aluminum Oxide Thin Films", *Japanese Journal of Applied Physics, Part 1: Regular Papers and Short Notes and Review Papers*, 40(1), (Jan. 2001), 285-289.

Jonsson, A. K., "Dielectric Permittivity and Intercalation Parameters of Li Ion Intercalated Atomic Layer Deposited $ZrO_2$", *Journal of the Electrochemical Society*, vol. 151, No. 3, (2004), F54-F58.

Kim, C. T., "Application of $Al_2O_3$ Grown by Atomic Layer Deposition to DRAM and FeRAM", *12th International Symposium in Integrated Ferroelectrics*, (Mar. 2000), p. 316.

Kim, Y, "Substrate dependence on the optical properties of $Al_2O_3$ films grown by atomic layer deposition", *Applied Physics Letters*, vol. 71, No. 25, (Dec. 22, 1997), 3604-3606.

Kukli, Kaupo, "Comparison of hafnium oxide films grown by atomic layer deposition from iodide and chloride precursors", *Thin Solid Films*, 416, (2002), 72-79.

Leskela, M, "ALD precursor chemistry: Evolution and future challenges", *Journal de Physique IV (Proceedings)*, 9(8), (Sep. 1999), 837-852.

Leskela, M., "ALD precursor chemistry: Evolution and future challenges", *J. Phys. IV France*, 9, (1999), 837-852.

Lu, Xu-Bing, et al., "Structure and dielectric properties of amorphous $LaAlO_3$ and $LaAlO_x$ Nsub y films as alternative gate dielectric materials", *Journal of Applied Physics*, 94(2), (Jul. 15, 2003), 1229-1234.

Muller, D. A., "The electronic structure at the atomic scale of ultrathin gate oxides", *Nature*, 399, (Jun. 24, 1999), 758-61.

Nalwa, H. S, "Handbook of Thin Film Materials", *Deposition and Processing of thin Films*, vol. 1, San Diego : Academic Press, (2002), 114-119.

Nam, Seok-Woo, "Study of $ZrO_2$ thin films for gate oxide applications", (Jul. 2001), 1720-1724.

Nieh, R, et al., "Evaluation of Silicon Surface Nitridation Effects on Ultra-thin $ZrO_2$ GateDielectrics", *Applied Physics Letters*, 81(9), (Aug. 26, 2002), 1663-1665.

Packan, Paula, "Pushing the Limits", *Science*, 285(5436), (Sep. 1999), 2079-2081.

Park, Byoung K., et al., "Interfacial reaction between chemically vapor-deposited $HfO_2$ thin films and a HF-cleaned Si substrate during film growth and postannealing", *Applied Physics Letters*, 80(13), (Apr. 1, 2002), 2368-70.

Poveshchenko, V P, et al., "Investigation of the phase composition of films of zirconium, hafnium and yttrium oxides", *Soviet Journal of Optical Technology*, 51(5), (1984), 277-279.

Robertson, John, "Band offsets of wide-band-gap oxides and implications for future electronic devices", *Journal of Vacuum Science & Technology B: Microelectronics and Nanometer Structures*, 18(3), (May 2000), 1785-1791.

Shin, Chang Ho, "Fabrication and Characterization of MFISFET Using $Al_2O_3$ Insulating Layer for Non-volatile Memory", *12th International Symposium in Integrated Ferroelectrics*, (Mar. 2000), 9 pages.

Sneh, Ofer, "Thin film atomic layer deposition equipment for semiconductor processing", *Thin Solid Films*, 402(1-2), Preparation and Characterization, Elsevier Sequoia, NL, vol. 402, No. 1-2, (2002), 248-261.

Suntola, T., "Atomic Layer Epitaxy", *Handbook of Crystal Growth, 3; Thin Films of Epitaxy, Part B: Growth Mechanics and Dynamics*, Amsterdam, (1994), 601-663.

Suntola, Tuomo, "Atomic layer epitaxy", *Thin Solid Films*, 216(1), (Aug. 28, 1992), 84-89.

Wilk, G. D., "High-K gate dielectrics: Current status and materials properties considerations", *Journal of Applied Physics*, 89(10), (May 2001), 5243-5275.

Youm, Minsoo, "Metal oxide semiconductor field effect transistor characteristics with iridium gate electrode on atomic layer deposited $ZrO_2$ high-k dielectrics", *Jpn. J. Appl. Phys.*, vol. 42, (Aug. 2003), 5010-5013.

Yu, Xiongfei, et al., "Advanced MOSFETs using $HfTaON/SiO_2$ gate dielectric and TaN metal gate with excellent performances for low standby power application", *IEEE International Electron Devices Meeting, 2005. IEDM Technical Digest.*, (Dec. 2005), 27-30.

Zhang, H, et al., "High permitivity thin film nanolaminates", *Journal of Applied Physics*, 87(4), (Feb. 2000), 1921-1924.

Zhang, H., "Atomic Layer Deposition of High Dielectric Constant Nanolaminates", *Journal of The Electrochemical Society*, 148(4), (Apr. 2001), F63-F66.

Zhu, J, et al., "Pulsed laser deposited ZrAlON films for high-k gate dielectric applications", *Applied Physics A*, 81, (Nov. 2005), 1167-1171.

Zhu, J, "Structure and dielectric properties of ultra-thin $ZrO_2$ films for high-k gate dielectric application prepared by pulsed laser deposition", *Applied Physics A Materials Science & Processing*, 78, (5), (2004), 741-744.

Zhu, J, et al., "Structure and dielectric properties of Zr Al O thin films prpared by pulsed laser deposition", *Microelectronic Engineering*, 66, (2003), 849-854.

Watanabe, et al., ""Role of Nitrogen Incorporation into Hf-Based High-k Gate Dielectrics for Termination of Local Current Leakage Paths"", *Jpn.Journ.Appl.Phys.*, vol. 43,, (2005), pp. L1333-L 1336.

HAFNIUM LANTHANIDE OXYNITRIDE FILMS

RELATED APPLICATIONS

This application is a continuation application of U.S. application Ser. No. 11/515,143, filed 31 Aug. 2006 now U.S. Pat. No. 7,563,730, which is incorporated herein by reference in its entirety.

This application is related to the and commonly assigned applications U.S. application Ser. No. 10/229,903, now entitled "ATOMIC LAYER DEPOSITED HfSiON DIELECTRIC FILMS WHEREIN EACH PRECURSOR IS INDEPENDENTLY PULSED," filed on 28 Aug. 2002, now U.S. Pat. No. 7,199,023, U.S. application Ser. No. 11/216,474, entitled "LANTHANUM ALUMINUM OXYNITRIDE DIELECTRIC FILMS," filed on 31 Aug. 2005, U.S. application Ser. No. 11/355,490, entitled "CONDUCTIVE LAYERS FOR HAFNIUM SILICON OXYNITRIDE FILMS," filed on 16 Feb. 2006, U.S. application Ser. No. 11/010,529, now entitled "LANTHANUM HAFNIUM OXIDE DIELECTRICS," filed on 13 Dec. 2004, now U.S. Pat. No. 7,235,501, and U.S. application Ser. No. 10/352,507, entitled "Atomic layer deposition of metal oxynitride layers as gate dielectrics and semiconductor device structures utilizing metal oxynitride layer," filed on 27 Jan. 2003, which applications are incorporated herein by reference.

This application is also related to co-pending and commonly assigned U.S. application Ser. No. 11/514,655, now entitled "TANTALUM ALUMINUM OXYNITRIDE HIGH-K DIELECTRIC", filed 31 Aug. 2006, U.S. application Ser. No. 11/514,533, entitled "SILICON LANTHANIDE OXYNITRIDE FILMS", filed 31 Aug. 2006, U.S. application Ser. No. 11/514,601, entitled "TANTALUM SILICON OXYNITRIDE HIGH-K DIELECTRICS AND METAL GATES", filed 31 Aug. 2006, U.S. application Ser. No. 11/514,545, entitled "TANTALUM LANTHANIDE OXYNITRIDE FILMS," filed 31 Aug. 2006, now U.S. Pat. No. 7,544,604, U.S. application Ser. No. 11/498,578, entitled "DEPOSITION OF ZrAlON FILMS", filed 3 Aug. 2006, U.S. application Ser. No. 11/515,114, now entitled "HAFNIUM TANTALUM OXYNITRIDE HIGH-K DIELECTRIC AND METAL GATES", filed 31 Aug. 2006, and U.S. application Ser. No. 11/514,558, now entitled "HAFNIUM ALUMINUM OXYNITRIDE HIGH-K DIELECTRIC AND METAL GATES", filed 31 Aug. 2006, which patent applications are incorporated herein by reference.

TECHNICAL FIELD

This disclosure relates generally to semiconductor devices and device fabrication.

BACKGROUND

The semiconductor device industry has a market driven need to reduce the size of devices used in products such as processor chips, mobile telephones, and memory devices such as dynamic random access memories (DRAMs). Currently, the semiconductor industry relies on the ability to reduce or scale the dimensions of its basic devices. This device scaling includes scaling a dielectric layer in devices such as, for example, capacitors and silicon-based metal oxide semiconductor field effect transistors (MOSFETs), which have primarily been fabricated using silicon dioxide. A thermally grown amorphous $SiO_2$ provides an electrically and thermodynamically stable material, where the interface of the $SiO_2$ layer with underlying silicon provides a high quality interface as well as superior electrical isolation properties. However, increased scaling and other requirements in microelectronic devices have created the need to use other materials as dielectric regions in a variety of electronic structures.

DETAILED DESCRIPTION

Figure 1:
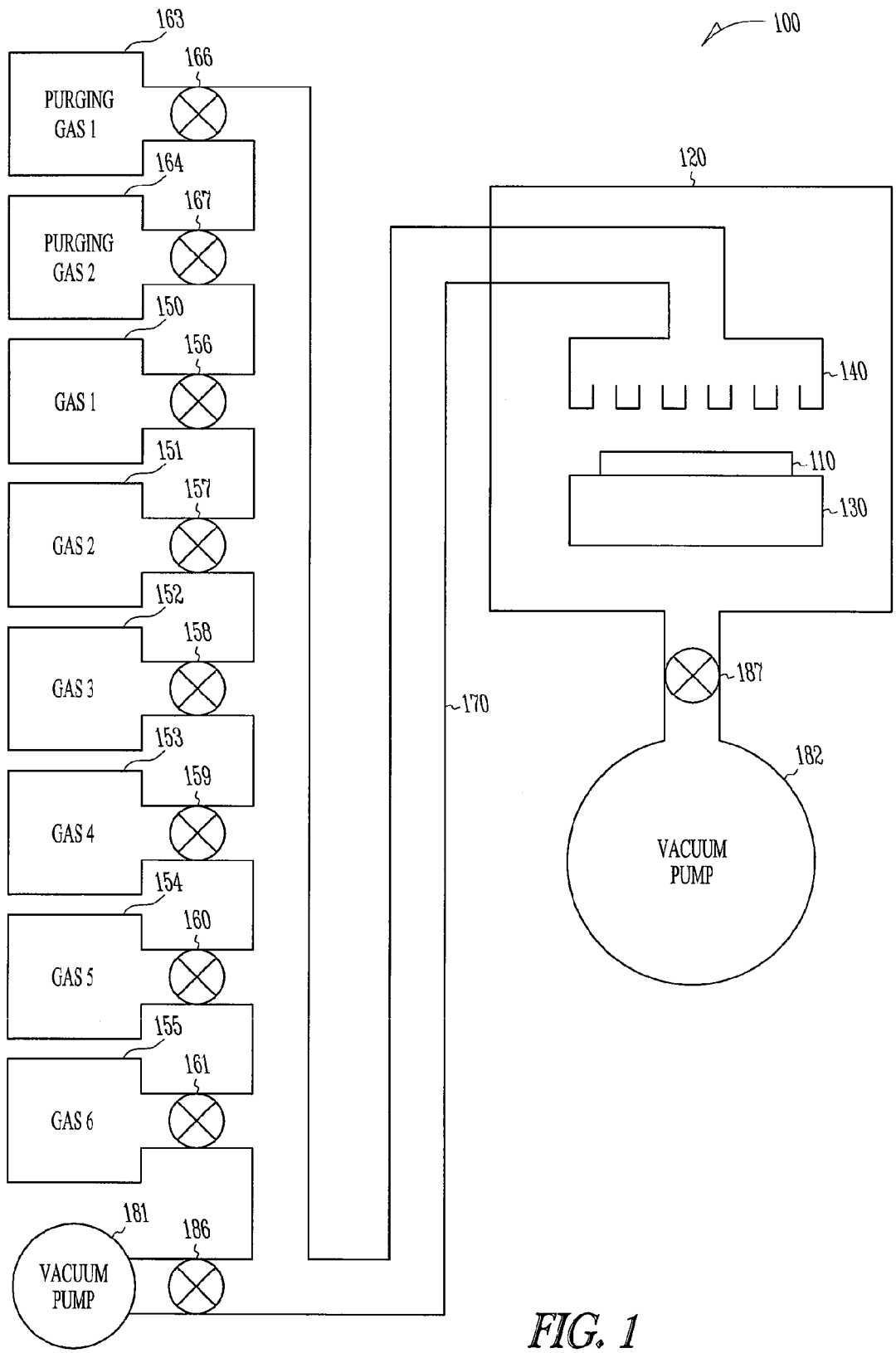
FIG. 1 depicts an embodiment of an atomic layer deposition system for processing a hafnium lanthanide oxynitride film.

The following detailed description refers to the accompanying drawings that show, by way of illustration, various embodiments of the present invention. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In the following description, the terms wafer and substrate may be used interchangeably to refer generally to any structure on which integrated circuits are formed and also to such structures during various stages of integrated circuit fabrication. The term substrate is understood to include a semiconductor wafer. The term substrate is also used to refer to semiconductor structures during processing and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors. The following detailed description is, therefore, not to be taken in a limiting sense.

To scale a dielectric region to reduce feature sizes to provide high density electronic devices, the dielectric region should have a reduced equivalent oxide thickness ($t_{eq}$). The equivalent oxide thickness quantifies the electrical properties, such as capacitance, of a dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a silicon surface will have a $t_{eq}$ larger than its thickness, t. This $t_{eq}$ results from the capacitance in the surface on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale a gate dielectric equivalent oxide thickness to less than 10 Å, the physical thickness requirement for a $SiO_2$ layer used for a gate dielectric may need to be approximately 4 to 7 Å. Additional requirements on a $SiO_2$ layer would depend on the electrode used in conjunction with the $SiO_2$ dielectric. Using a conventional polysilicon electrode may result in an additional increase in $t_{eq}$ for the $SiO_2$ layer. Thus, designs for future devices may be directed towards a physical $SiO_2$ dielectric layer of about 5 Å or less. Such a small thickness requirement for a $SiO_2$ oxide layer creates additional problems.

Silicon dioxide is used as a dielectric layer in devices, in part, due to its electrical isolation properties in a $SiO_2$—Si based structure. This electrical isolation is due to the relatively large band gap of $SiO_2$ (8.9 eV), making it a good insulator from electrical conduction. Significant reductions in its band gap may eliminate it as a material for a dielectric region in an electronic device. As the thickness of a $SiO_2$ layer decreases, the number of atomic layers or monolayers of the material decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers may not form a full band gap. The lack of a full band gap in a $SiO_2$ dielectric may cause an effective short between an underlying electrode and an overlying electrode. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a dielectric region in such future devices.

In many cases, for a typical dielectric layer, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternative dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower device operating voltages and smaller device dimensions may be realized by a significant number of materials, but additional fabricating requirements make determining a suitable replacement for $SiO_2$ difficult. The current view for the microelectronics industry is still for silicon-based devices. This may require that the dielectric material employed be grown on a silicon substrate or a silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO_2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer should provide a high quality interface.

Using $SiO_2$ as a dielectric layer in a device has allowed the formation of a $SiO_2$ layer that results in an amorphous dielectric. Having an amorphous structure for a dielectric provides for reducing problems of leakage current associated with grain boundaries in polycrystalline dielectrics that provide high leakage paths. Additionally, grain size and orientation changes throughout a polycrystalline dielectric can cause variations in the film's dielectric constant, along with uniformity and surface topography problems. Materials having a high dielectric constant relative to $SiO_2$ may also have a crystalline form, at least in a bulk configuration. The best candidates for replacing $SiO_2$ as a dielectric in a device are those that can be fabricated as a thin layer with an amorphous form and that have high dielectric constants.

Capacitor applications have used high-κ dielectric materials, which are insulating materials having a dielectric constant greater than silicon dioxide. Such high-κ dielectric materials include silicon oxynitride (SiON, κ~6), alumina (Al$_2$O$_3$, κ~9), and oxide/nitride composites (SiO$_2$/Si$_3$N$_4$, κ~6). Other possible candidates include metal oxides (κ~8-80), nitrides (κ~7-30), oxynitrides (κ~6-25), silicates (κ~6-20), carbides (κ~6-15), and complex titanates (κ~>100). Factors for selecting appropriate materials include physical, chemical and thermal stability as well as etch-ability and stoichiometric reproducibility. In field effect transistor (FET) applications, there are other factors to consider while addressing device scalability. The selected dielectric should provide stable amorphous and adherent films in the thickness range of 1 nm to 100 nm at temperatures ranging from room temperature to 1000° C. A relatively defect-free composition that is uniform and reproducible with a fixed charge density and trap density of less than $10^{11}$ cm$^{-2}$ in films of such composition is a factor. A factor includes dielectric materials that provide a stable non-reactive interface with a silicon substrate such that the interface has an interface state density much less than $10^{11}$ cm$^{-2}$. Such interface state densities may occur when silicon bonds at the interface are saturated with high strength covalent bonds with molecular elements of the dielectric material. Another factor deals with current transport through the dielectric that should be controlled by tunneling, which is independent of temperature, rather than by trap-assisted thermally dependent transport. The conductivity of the dielectric should be equal to or lower than SiO$_2$ films when voltage is stressed to a field strength of $5 \times 10^6$ V/cm. To address the current transport, a dielectric material having a bandgap greater than 5 eV and having an electron and hole barrier height greater than 2 eV at a silicon interface may be considered. An additional factor to consider is using dielectric materials with a destructive breakdown strength greater than $6 \times 10^6$ V/cm. Other factors for selecting a dielectric material for use in a variety of electronic devices, such as for the dielectric in FETs, relates to processing characteristics. Such processing characteristics include compatibility with gate material, selective etch-ability, chemical inertness to contaminants, dopant and post processing environments (temperature, pressure, ambients), and intrinsic properties associated with annealing of defects/damages caused by post-processing such as ion-implantation, plasma-radiation, and gate/back-end processing.

In various embodiments, mixed metal oxynitrides (with silicon included as a metal) are constructed as dielectric films in a variety of electronic devices and systems. Most oxynitrides are thermally stable and can integrate into semiconductor device processing. With nitrogen concentration in an oxynitride film at 30% or higher, such oxynitrides are chemically inert. With processing conditions controlled to provide appropriately low partial pressures of hydrogen and ON ions, oxynitride films with a wide range of nitrogen to oxygen ratio can be deposited over a silicon substrate with low fixed charge and interface states density. On the other hand, charge trapping and transport characteristics are dependent on relative ratio of nitrogen to oxygen content in the constructed film. Films with nitrogen concentration twice that of oxygen (for example, approximately 40 atomic per cent nitrogen, approximately 20 atomic per cent oxygen, and approximately 40 atomic per cent metal or silicon) have a lower bandgap, higher trap density, and transport characteristics dominated by Frenkel-Poole conduction. Such materials may not be well suited for gate dielectric applications. However, such films exhibit higher κ values. With increasing oxygen concentration in oxynitride films, the bandgap is raised, current leakage is reduced, and the low frequency κ value is also somewhat reduced. In addition with increasing oxygen concentration, the trap density is reduced, the trap energy depth is increased, and the carrier transport ceases to be trap-assisted, exhibits tunneling conduction, and has a weak temperature dependence, if any. In various embodiments, a dielectric layer includes an oxynitride film having approximately 30 atomic % oxygen and approximately 30-35 atomic % nitrogen. With high enough nitrogen content, oxygen-vacancy induced defects in films is negligible when compared with metal oxides.

Silicon oxynitride (SiON) has been used as a gate dielectric and gate insulator for a non-volatile FET device. Silicon oxynitride at a composition range of Si$_2$ON$_2$ exhibits a dielectric constant of 6.5 and a bandgap of approximately 6.5 eV compared to a stoichiometric nitride of κ=7.5 and a bandgap of 5.1 eV. Aluminum oxynitride (AlON) is expected to have a bandgap greater than 5 eV with a κ value similar to SiON. Compared to SiON, metal oxynitrides such as ZrON, HfON, LaON, and TaON and other single metal oxynitrides are expected to have a lower bandgap.

In various embodiments, bimetal (or metal/silicon) oxynitrides based on Si, Al, Hf, La, and Ta are used as dielectric films in a variety of electronic devices and systems. These bimetal oxynitrides may provide a bandgap range from 5 eV to greater than 7 eV. Estimates for bandgaps include a bandgap of Si—Al—ON of greater than 7 eV, a bandgap of Si—Hf—ON of about 6.9 eV, a bandgap of Al—Hf—ON of about 6.8 eV, a bandgap of Si—Ta—ON of about 6 eV, a bandgap of Al—Ta—ON of about 6 eV. Bimetal oxynitrides Hf—Ta—ON, Hf—La—ON, Al—La—ON, Ta—La—ON, and Si—La—ON are estimated to exhibit significantly lower bandgaps. The κ value for Si—Al—ON is estimated at approximately 7 to 8, while the κ values for the other oxynitrides of this group are estimated to be in the range from about 15 to 25.

In an embodiment, a film of hafnium lanthanide oxynitride may be used as a dielectric layer for application in a variety of electronic devices, replacing the use of silicon oxide to provide a higher dielectric constant. The hafnium lanthanide oxynitride film may be formed as a hafnium lanthanum oxynitride film. In other embodiments, one of more lanthanides may be used to form a hafnium lanthanide oxynitride film. The lanthanide, represented by the expression Ln, may include one or more elements from the lanthanide group consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). In various embodiments, a dielectric layer may be constructed containing hafnium lanthanide oxynitride formed using atomic layer deposition with a metal electrode formed in contact with the dielectric layer. The metal electrode may be formed by atomic layer deposition. The metal electrode may be formed by substituting a desired metal material for a previously disposed substitutable material. The metal electrode may be formed as a self aligned metal electrode on and contacting the dielectric layer. The metal electrode may be formed on the dielectric layer using a previously disposed sacrificial carbon layer on the dielectric layer and sacrificial carbon sidewall spacers adjacent to the sacrificial carbon layer.

The term hafnium lanthanide oxynitride is used herein with respect to a composition that essentially consists of hafnium, lanthanide, oxygen, and nitrogen in a form that may be stoichiometric, non-stoichiometric, or a combination of stoichiometric and non-stoichiometric. In an embodiment, the lanthanide may be lanthanum. Alternatively, the lanthanide may be one or more elements from the lanthanide group of elements. A hafnium lanthanide oxynitride film may also be referred to as a hafnium lanthanide oxygen nitrogen film. Other nomenclature for a composition that essentially consists of hafnium, lanthanide, oxygen, and nitrogen may be known to those skilled in the art. In an embodiment, hafnium lanthanide oxynitride may be formed substantially as a stoichiometric hafnium lanthanide oxynitride film. In an embodiment, hafnium lanthanide oxynitride may be formed substantially as a non-stoichiometric hafnium lanthanide oxynitride film. In an embodiment, hafnium lanthanide oxynitride may be formed substantially as a combination film of non-stoichiometric hafnium lanthanide oxynitride and stoichiometric hafnium lanthanide oxynitride. Herein, a hafnium lanthanide oxynitride composition may be expressed as HfLnON, $HfLnON_x$, $Hf_xLn_yO_zN_r$, or other equivalent form. Herein, a hafnium lanthanum oxynitride composition may be expressed as HfLaON, $HfLaON_x$, $Hf_xLa_yO_zN_r$, or other equivalent form. The expression HfLnON or its equivalent forms may be used to include HfLnON in a form that is stoichiometric, non-stoichiometric, or a combination of stoichiometric and non-stoichiometric hafnium lanthanide oxynitride. The expressions LnO, $LnO_z$, or its equivalent forms may be used to include lanthanide oxide in a form that is stoichiometric, non-stoichiometric, or a combination of stoichiometric and non-stoichiometric. With respect to forms that are stoichiometric, non-stoichiometric, or a combination of stoichiometric and non-stoichiometric, expressions such as LnN, LaO, LaN, HfON, LnON, LaON, $LaO_z$, $LaN_r$, $HfO_t$, $HfN_s$, $HfON_r$, $LnON_r$, $LaON_r$ etc. may be used in a similar manner as $LnO_z$. In various embodiments, a hafnium lanthanide oxynitride film may be doped with elements or compounds other than hafnium, lanthanide, oxygen, and nitrogen.

In an embodiment, a hafnium lanthanide oxynitride dielectric film may be formed using atomic layer deposition (ALD). Forming such structures using atomic layer deposition may allow control of transitions between material layers. As a result of such control, atomic layer deposited hafnium lanthanide oxynitride dielectric films can have an engineered transition with a surface on which it is formed.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber may be purged with a gas, where the purging gas may be an inert gas. Between the pulses, the reaction chamber may be evacuated. Between the pulses, the reaction chamber may be purged with a gas and evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favorable precursor chemistry where the precursors absorb and react with each other aggressively on the substrate, one ALD cycle can be performed in less than one second in properly designed flow type reaction chambers.

Typically, precursor pulse times range from about 0.5 sec to about 2 to 3 seconds. Pulse times for purging gases may be significantly longer, for example, pulse times of about 5 to about 30 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Atomic layer deposition provides control of film thickness in a straightforward manner by controlling the number of growth cycles.

The precursors used in an ALD process may be gaseous, liquid or solid. However, liquid or solid precursors should be volatile. The vapor pressure should be high enough for effective mass transportation. Also, solid and some liquid precursors may need to be heated inside the atomic layer deposition system and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control of the ALD method that relies on the reaction of the precursor at the substrate surface. A slight decomposition, if slow compared to the ALD growth, may be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate may be followed by an inert gas pulse to remove excess precursor and by-products from the reaction chamber prior to pulsing the next precursor of the fabrication sequence.

By RS-ALD, films can be layered in equal metered sequences that may all be identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

Processing by RS-ALD provides continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with a resolution of one to two monolayers. RS-ALD processes allow for deposition control on the order of monolayers and the ability to deposit monolayers of amorphous films.

Herein, a sequence refers to the ALD material formation based on an ALD reaction of a precursor with its reactant precursor. For example, forming hafnium nitride from a $HfCl_4$ precursor and $NH_3$, as its reactant precursor, includes a hafnium/nitrogen sequence. In various ALD processes that form a nitride or a composition that contains nitrogen, a reactant precursor that contains nitrogen is used to supply nitrogen. Herein, a precursor that contains nitrogen and that supplies nitrogen to be incorporated in the ALD composition formed, which may be used in an ALD process with precursors supplying the other elements in the ALD composition, is referred to as a nitrogen reactant precursor. In the above example, $NH_3$ is a nitrogen reactant precursor. Similarly, an ALD sequence for a metal oxide may be referenced with respect to the metal and oxygen. For example, an ALD sequence for hafnium oxide may also be referred to as a hafnium/oxygen sequence. In various ALD processes that form an oxide or a composition that contains oxygen, a reactant precursor that contains oxygen is used to supply the oxygen. Herein, a precursor that contains oxygen and that supplies oxygen to be incorporated in the ALD composition formed, which may be used in an ALD process with precursors supplying the other elements in the ALD composition, is referred to as an oxygen reactant precursor. With an ALD process using $HfCl_4$ and water vapor to form hafnium oxide, water vapor is an oxygen reactant precursor. An ALD cycle may include pulsing a precursor, pulsing a purging gas for the precursor, pulsing a reactant precursor, and pulsing the reactant precursor's purging gas. An ALD cycle may include pulsing a precursor, evacuating the reactant chamber, pulsing a reactant precursor, and evacuating the reactant chamber. An ALD cycle may include pulsing a precursor, pulsing a purging gas for the precursor and evacuating the reactant chamber, pulsing a reactant precursor, and pulsing the reactant precursor's purging gas and evacuating the reactant chamber.

In forming a layer of a metal species, an ALD sequence may deal with pulsing a reactant precursor to the substrate surface on which a metal-containing species has been absorbed such that the reactant precursor reacts with the metal-containing species resulting in the deposited metal and a gaseous by-product that can be removed during the subsequent purging/evacuating process. Alternatively, in forming a layer of a metal species, an ALD sequence may deal with reacting a precursor containing the metal species with a substrate surface. A cycle for such a metal forming sequence may include pulsing a purging gas after pulsing the precursor containing the metal species to deposit the metal. Additionally, deposition of a semiconductor material may be realized in a manner similar to forming a layer of a metal, given the appropriate precursors for the semiconductor material.

In an ALD formation of a composition having more than two elements, a cycle may include a number of sequences to provide the elements of the composition. For example, a cycle for an ALD formation of an $ABO_x$ composition may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas, which may be viewed as a cycle having two sequences. In an embodiment, a cycle may include a number of sequences for element A and a different number of sequences for element B. There may be cases in which ALD formation of an $ABO_x$ composition uses one precursor that contains the elements A and B, such that pulsing the AB containing precursor followed by its reactant precursor onto a substrate may include a reaction that forms $ABO_x$ on the substrate to provide an AB/oxygen sequence. A cycle of an AB/oxygen sequence may include pulsing a precursor containing A and B, pulsing a purging gas for the precursor, pulsing an oxygen reactant precursor to the A/B precursor, and pulsing a purging gas for the reactant precursor. A cycle may be repeated a number of times to provide a desired thickness of the composition. In an embodiment, a cycle for an ALD formation of the quaternary composition, hafnium lanthanide oxygen nitrogen, may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas/a third precursor/a purging gas for the third precursor/a third reactant precursor/the third reactant precursor's purging gas, which may be viewed as a cycle having three sequences. In an embodiment, a layer substantially of a hafnium lanthanide oxynitride composition is formed on a substrate mounted in a reaction chamber using ALD in repetitive lanthanide/oxygen and hafnium/nitrogen sequences using precursor gases individually pulsed into the reaction chamber. In an embodiment, a layer substantially of a hafnium lanthanide oxynitride composition is formed on a substrate mounted in a reaction chamber using ALD in repetitive lanthanide/nitrogen and hafnium/oxygen sequences using precursor gases individually pulsed into the reaction chamber. In an embodiment, a substantially hafnium lanthanide oxynitride composition is formed by ALD having approximately 30% nitrogen and 30% oxygen concentrations in the resultant HfLnON dielectric film.

FIG. 1 shows an embodiment of an atomic layer deposition system 100 for processing a dielectric film containing a $Hf_x Ln_y O_z N_r$ layer. The elements depicted are those elements necessary for discussion of various embodiments for forming HfLnON such that those skilled in the art may practice embodiments of the present invention without undue experimentation. A substrate 110 is located inside a reaction chamber 120 of ALD system 100. Also located within reaction chamber 120 is a heating element 130, which is thermally coupled to substrate 110 to control the substrate temperature. A gas-distribution fixture 140 introduces precursor gases to the substrate 110. Each precursor gas originates from individual gas sources 150-155 whose flow is controlled by mass-flow controllers 156-161, respectively. Gas sources 150-155 provide a precursor gas either by storing the precursor as a gas or by providing a location and apparatus for evaporating a solid or liquid material to form the selected precursor gas. Furthermore, additional gas sources may be included, one for each metal precursor employed and one for each reactant precursor associated with each metal precursor.

Also included in the ALD system are purging gas sources 163, 164, each of which is coupled to mass-flow controllers 166, 167, respectively. Furthermore, additional purging gas sources may be constructed in ALD system 100, one purging gas source for each precursor gas. For a process that uses the same purging gas for multiple precursor gases, less purging gas sources are required for ALD system 100. Gas sources 150-155 and purging gas sources 163-164 are coupled by their associated mass-flow controllers to a common gas line or conduit 170, which is coupled to the gas-distribution fixture 140 inside reaction chamber 120. Gas conduit 170 is also coupled to vacuum pump, or exhaust pump, 181 by mass-flow controller 186 to remove excess precursor gases, purging gases, and by-product gases at the end of a purging sequence from gas conduit 170.

Vacuum pump, or exhaust pump, 182 is coupled by mass-flow controller 187 to remove excess precursor gases, purging gases, and by-product gases at the end of a purging sequence from reaction chamber 120. For convenience, control displays, mounting apparatus, temperature sensing devices, substrate maneuvering apparatus, and necessary electrical connections as are known to those skilled in the art are not shown in FIG. 1. The use, construction and fundamental operation of reaction chambers for deposition of films are understood by those of ordinary skill in the art of semiconductor fabrication. Embodiments of the present invention may be practiced on a variety of such reaction chambers without undue experimentation. Furthermore, one of ordinary skill in the art will comprehend the necessary detection, measurement, and control techniques in the art of semiconductor fabrication upon reading the disclosure.

In an embodiment, a hafnium lanthanide oxynitride layer may be structured as one or more monolayers. A film of hafnium lanthanide oxynitride, structured as one or more monolayers, may have a thickness that ranges from a monolayer to thousands of angstroms or more. The film may be processed using atomic layer deposition. Embodiments of an atomic layer deposited hafnium lanthanide oxynitride layer have a larger dielectric constant than silicon dioxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current.

Prior to forming the hafnium lanthanide oxynitride film using ALD, the surface on which the hafnium lanthanide oxynitride film is to be deposited may undergo a preparation stage. The surface may be the surface of a substrate for an integrated circuit. In an embodiment, the substrate used for forming a transistor may include a silicon or silicon containing material. In other embodiments, silicon germanium, germanium, gallium arsenide, silicon-on-sapphire substrates, or other suitable substrates may be used. A preparation process may include cleaning the substrate and forming layers and regions of the substrate, such as drains and sources, prior to forming a gate dielectric in the formation of a metal insulator semiconductor (MIS) transistor. Alternatively, active regions may be formed after forming the dielectric layer, depending on the over-all fabrication process implemented. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon-based substrate and a hafnium lanthanide oxynitride dielectric formed using the atomic layer deposition process. The material composition of an interface layer and its properties are typically dependent on process conditions and the condition of the substrate before forming the dielectric layer. Though the existence of an interface layer may effectively reduce the dielectric constant associated with the dielectric layer and its substrate interface layer, a $SiO_2$ interface layer or other composition interface layer may improve the interface density, fixed charge density, and channel mobility of a device having this interface layer.

The sequencing of the formation of the regions of an electronic device, such as a transistor, being processed may follow typical sequencing that is generally performed in the fabrication of such devices as is well known to those skilled in the art. Included in the processing prior to forming a dielectric may be the masking of substrate regions to be protected during the dielectric formation, as is typically performed in semiconductor fabrication. In an embodiment, an unmasked region includes a body region of a transistor; however, one skilled in the art will recognize that other semiconductor device structures may utilize this process.

In various embodiments, between each pulsing of a precursor used in an atomic layer deposition process, a purging gas may be pulsed into the ALD reaction chamber. Between each pulsing of a precursor, the ALD reactor chamber may be evacuated using vacuum techniques as is known by those skilled in the art. Between each pulsing of a precursor, a purging gas may be pulsed into the ALD reaction chamber and the ALD reactor chamber may be evacuated.

In an embodiment, an ALD cycle for forming HfLnON includes sequencing component-containing precursors in the order of lanthanide, oxygen, hafnium, and nitrogen with appropriate purging between the different component-containing precursors. Full coverage or partial coverage of a monolayer on a substrate surface may be attained for pulsing of a metal-containing precursor. In an embodiment, an ALD cycle for forming HflnON includes sequencing the component-containing precursors in various permutations. In an embodiment, an ALD cycle to form hafnium lanthanide oxynitride includes a number, x, of lanthanide/oxygen sequences and a number, y, of hafnium/nitrogen sequences. In an embodiment, an ALD cycle to form hafnium lanthanide oxynitride includes a number, x, of lanthanide/nitrogen sequences and a number, y, of hafnium/oxygen sequences. In an embodiment, the number of sequences x and y is selected to engineer the relative amounts of hafnium, lanthanide, oxygen, and nitrogen. In an embodiment, the number of sequences x and y is selected to form a nitrogen-rich hafnium lanthanide oxynitride. In an embodiment, the number of sequences x and y are selected to form an oxygen-rich hafnium lanthanide oxynitride. The hafnium lanthanide oxynitride may be engineered as a lanthanide-rich dielectric relative to the amount of hafnium in the dielectric. The hafnium lanthanide oxynitride may be engineered as a hafnium-rich dielectric relative to the amount of lanthanide in the dielectric. The pulsing of the individual component-containing precursors may be performed independently in a non-overlapping manner using the individual gas sources 150-155 and flow controllers 156-161 of ALD system 100 of FIG. 1.

Each precursor may be pulsed into the reaction chamber for a predetermined period, where the predetermined period can be set separately for each precursor. Additionally, for various ALD formations, each precursor may be pulsed into the reaction chamber under separate environmental conditions. The substrate may be maintained at a selected temperature and the reaction chamber maintained at a selected pressure independently for pulsing each precursor. Appropriate temperatures and pressures may be maintained, whether the precursor is a single precursor or a mixture of precursors.

A number of precursors containing a lanthanide may be used to provide the lanthanide to a substrate for an integrated circuit. In an embodiment, a precursor containing a lanthanide may include $Ln(thd)_3$ (thd=2,2,6,6-tetramethyl-3,5- heptanedione)=Ln(C$_{11}$H$_{19}$O$_2$)$_3$. In an embodiment, a lanthanum-containing precursor is pulsed onto a substrate in an ALD reaction chamber. A number of precursors containing lanthanum that may be used includes, but is not limited to, La(thd)$_3$, La(N(SiMe$_3$)$_2$)$_3$=C$_{18}$H$_{54}$N$_3$LaSi$_6$, tris (2,2,6,6-tetramethyl-3,5-heptanedionato)lanthanum (III) tetraglyme adduct=La(C$_{11}$H$_{19}$O$_2$)$_3$CH$_3$(OCH$_2$CH$_2$)$_4$OCH$_3$, trisethylcyclopentadionatolanthanum (La(EtCp)$_3$), and trisdipyvaloylmethanatolanthanum (La(DPM)$_3$). Me is an abbreviation for CH$_3$, Et is an abbreviation for ethyl (CH$_2$CH$_3$), and Cp is an abbreviation for a cyclopentadienyl ligand having the formula C$_5$H$_5$. In an embodiment, H$_2$ may be pulsed along with a La(EtCp)$_3$ precursor or a La(DPM)$_3$ precursor to reduce carbon contamination in the fabricated film. Other precursors may be used in embodiments in which the lanthanide is other than lanthanum.

In various embodiments, after pulsing the lanthanide-containing precursor and purging the reaction chamber of excess precursor and by-products from pulsing the precursor, a reactant precursor may be pulsed into the reaction chamber. The reactant precursor may be an oxygen reactant precursor that may include, but is not limited to, one or more of water, atomic oxygen, molecular oxygen, ozone, hydrogen peroxide, a water—hydrogen peroxide mixture, alcohol, or nitrous oxide. In addition, the pulsing of the lanthanide precursor may use a pulsing period that provides uniform coverage of a monolayer on the surface or may use a pulsing period that provides partial coverage of a monolayer on the surface during a lanthanide sequence.

A number of precursors containing hafnium may be used to provide the hafnium to a substrate for an integrated circuit. In an embodiment, a precursor containing hafnium may include anhydrous hafnium nitride, Hf(NO$_3$)$_4$. In an embodiment using a Hf(NO$_3$)$_4$ precursor on a hydrogen-terminated silicon, the substrate temperature may be maintained at a temperature ranging from about 160° C. to about 180° C. In an embodiment, a hafnium precursor may include HfCl$_4$. In an embodiment using a HfCl$_4$ precursor, the substrate temperature may be maintained at a temperature ranging from about 180° C. to about 600° C. In an embodiment using a HfCl$_4$ precursor, the substrate temperature may be maintained at a temperature ranging from about 300° C. to about 940° C. In an embodiment, a hafnium precursor may be HfI$_4$. In an embodiment using a HfI$_4$ precursor, the substrate temperature may be maintained at a temperature of about 300° C. Hafnium oxide may be grown by ALD using a Hf[N(CH$_3$)(C$_2$H$_5$)]$_4$, which may be known as a homoleptic tetrakis(dialkylamino) hafnium(IV) compound, and water as an oxygen reactant. Other types of tetrakis(dialkylamino) hafnium compounds may also be used, such as hafnium tetrakis dimethylamine, Hf[N(CH$_3$)$_2$]$_4$, or hafnium tetrakis diethylamine, Hf[N(C$_2$H$_5$)$_2$]$_4$, as a hafnium-containing precursor. In various embodiments, use of the individual hafnium-containing precursors is not limited to the temperature ranges of the above example embodiments. In addition, the pulsing of the hafnium precursor may use a pulsing period that provides uniform coverage of a monolayer on the surface or may use a pulsing period that provides partial coverage of a monolayer on the surface during a hafnium sequence.

In various embodiments, nitrogen may be used as a purging gas and a carrier gas for one or more of the sequences used in the ALD formation of hafnium lanthanide oxynitride. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

In an embodiment, after repeating a selected number of ALD cycles, a determination is made as to whether the number of cycles equals a predetermined number to form the desired hafnium lanthanide oxynitride layer. If the total number of cycles to form the desired thickness has not been completed, a number of cycles is repeated. In an embodiment, the thickness of a hafnium lanthanide oxynitride layer formed by atomic layer deposition is determined by a fixed growth rate for the pulsing periods and precursors used, set at a value such as N nm/cycle, and the number of cycles conducted. In an embodiment, depending on the precursors used for ALD formation of a HfLnON film, the process is conducted in an ALD window, which is a range of temperatures in which the growth rate is substantially constant. In an embodiment, if such an ALD window is not available, the ALD process is conducted at the same set of temperatures for each ALD sequence in the process. For a desired hafnium lanthanide oxynitride layer thickness, t, in an application, the ALD process is repeated for t/N total cycles. Once the t/N cycles have completed, no further ALD processing for the hafnium lanthanide oxynitride layer is required. In an embodiment, a hafnium lanthanide oxynitride layer processed at relatively low temperatures associated with atomic layer deposition provides an amorphous layer.

In an embodiment, a HfLnON film may be grown to a desired thickness by repetition of a process including atomic layer deposition of layers of LnO and HfN and/or layers of HfO and LnN followed by annealing. In an embodiment, a base thickness may be formed according to various embodiments such that forming a predetermined thickness of a HfLnON film may be conducted by forming a number of layers having the base thickness. As can be understood by one skilled in the art, determining the base thickness depends on the application and can be determined during initial processing without undue experimentation. Relative amounts of hafnium, lanthanide, oxygen, and nitrogen in a HfLnON film may be controlled by regulating the relative thicknesses of the individual layers of oxides and nitrides formed. In addition, relative amounts of hafnium, lanthanide, oxygen, and nitrogen in a HfLnON film may be controlled by forming a layer of HfLnON as multiple layers of different base thickness and by regulating the relative thicknesses of the individual layers of oxides and nitrides formed in each base layer prior to annealing. As can be understood by those skilled in the art, particular effective growth rates for the engineered hafnium lanthanide oxynitride film can be determined during normal initial testing of the ALD system used in processing a hafnium lanthanide oxynitride dielectric for a given application without undue experimentation.

Figure 2A:
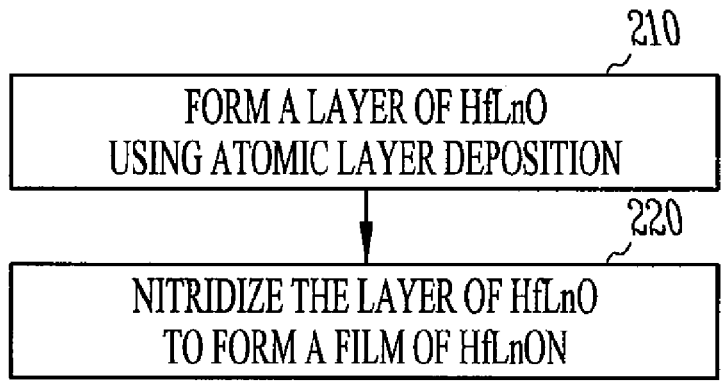
FIG. 2A shows a flow diagram of features of an embodiment for forming a hafnium lanthanide oxynitride film using atomic layer deposition and nitridization.

FIG. 2A shows a flow diagram of features of an embodiment for forming HfLnON using atomic layer deposition and nitridization. At 210, a layer of HfLnO is formed using atomic layer deposition. At 220, the layer of HfLnO is subjected to a nitridization to form a HfLnON film. The nitridization may be a high temperature nitridization. In the nitridization process, active nitrogen may be introduced by microwave plasma. In the nitridization process, active nitrogen may be introduced by a NH$_3$ anneal. A high temperature nitridization is a nitridizing process that is performed at temperatures equal to or above 500° C. In various embodiments, HfLnO may be formed by atomic layer deposition using ALD cycles of lanthanide/oxygen sequences and hafnium/oxygen sequences. Depending on the amounts of lanthanide, hafnium, and oxygen to be provided in the HfLaO film, the ALD cycle can be selected from a number of different permutations of lanthanide/oxygen sequences and hafnium/oxygen sequences.

Figure 2B:
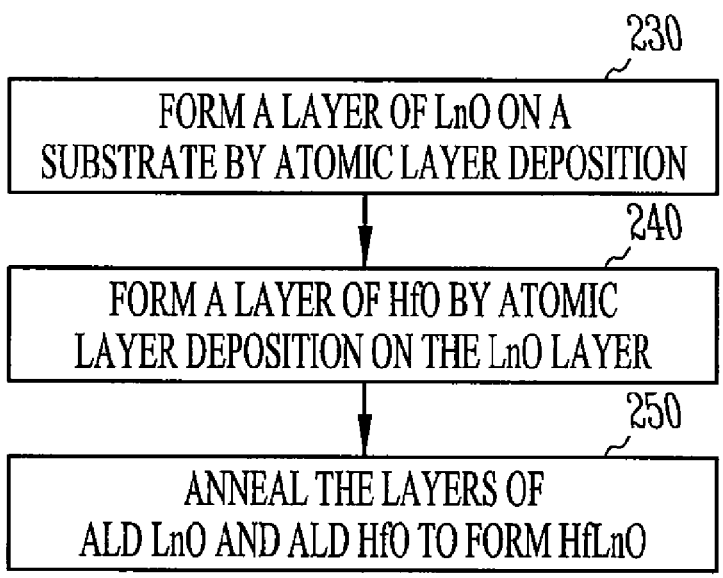
FIG. 2B shows a flow diagram of features of an embodiment for forming hafnium lanthanide oxide using atomic layer deposition for nitridization to a hafnium lanthanide oxynitride film.

FIG. 2B shows a flow diagram of features of an embodiment for forming HfLnO using atomic layer deposition for nitridization to a HfLnON film. At 230, a layer of lanthanide oxide is formed on a substrate by atomic layer deposition. At 240, a layer of hafnium oxide is formed by atomic layer deposition on the layer of lanthanide oxide. At 250, the layers of lanthanide oxide and hafnium oxide are annealed to form a layer of HfLnO. The order of forming LnO and HfO may be interchanged. The layer of HfLnO may be nitridized to form HfLnON. Alternatively, the layers of lanthanide oxide and hafnium oxide may be nitridized during the annealing process. In an embodiment, alternating layers of ALD lanthanide oxide and ALD hafnium oxide may be formed to a desired thickness prior to nitridization. In an embodiment, a layer of ALD lanthanide oxide and a layer of ALD hafnium oxide may be formed, each to a desired thickness, the layers of ALD lanthanide oxide and ALD hafnium oxide nitridized to form a HfLnON layer. Then, a layer of ALD lanthanide oxide and a layer of ALD hafnium oxide may be formed on the HfLnON layer, the layers of ALD lanthanide oxide and ALD hafnium oxide nitridized to form a HfLnON layer on and contiguous with the previously formed HfLnON layer. This process may be continued until the desired thickness of HfLnON is formed.

In an embodiment, ALD LaO may be formed using a number of precursors containing lanthanum to provide the lanthanum to a substrate for an integrated circuit. Such lanthanum-containing precursors include, but are not limited to, $La(thd)_3$, tris (2,2,6,6-tetramethyl-3,5-heptanedionato)lanthanum (III) tetraglyme adduct, $La(EtCp)_3$, and $La(DPM)_3$. After pulsing the lanthanum-containing precursor and purging the reaction chamber of excess precursor and by-products from pulsing the precursor, an oxygen reactant precursor may be pulsed into the reaction chamber. The oxygen reactant precursor may include, but is not limited to, one or more of water, atomic oxygen, molecular oxygen, ozone, hydrogen peroxide, a water—hydrogen peroxide mixture, alcohol, or nitrous oxide. After pulsing the oxygen-containing precursor, the reaction chamber may be purged of excess precursor and by-products. In addition, the pulsing of the precursors may use pulsing periods that provide uniform coverage of a monolayer on the surface or may use pulsing periods that provide partial coverage of a monolayer on the surface during a lanthanum/oxygen ALD cycle.

In an embodiment, ALD HfO may be formed using a number of precursors containing hafnium to provide the hafnium to a substrate for an integrated circuit. Such hafnium-containing precursors include, but are not limited to, a hafnium halide, such as $HfCl_4$ and $HfI_4$, $Hf(NO_3)_4$, $Hf[N(CH_3)(C_2H_5)]_4$, $Hf[N(CH_3)_2]_4$, and $Hf[N(C_2H_5)_2]_4$. After pulsing the hafnium-containing precursor and purging the reaction chamber of excess precursor and by-products from pulsing the precursor, an oxygen reactant precursor may be pulsed into the reaction chamber. The oxygen reactant precursor may include, but is not limited to, one or more of water, atomic oxygen, molecular oxygen, ozone, hydrogen peroxide, a water—hydrogen peroxide mixture, alcohol, or nitrous oxide. In addition, the pulsing of the precursors may use pulsing periods that provide uniform coverage of a monolayer on the surface or may use pulsing periods that provide partial coverage of a monolayer on the surface during a during an ALD cycle forming HfO.

In various embodiments, nitrogen may be used as a purging gas and a carrier gas for one or more of the sequences. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

Figure 3:
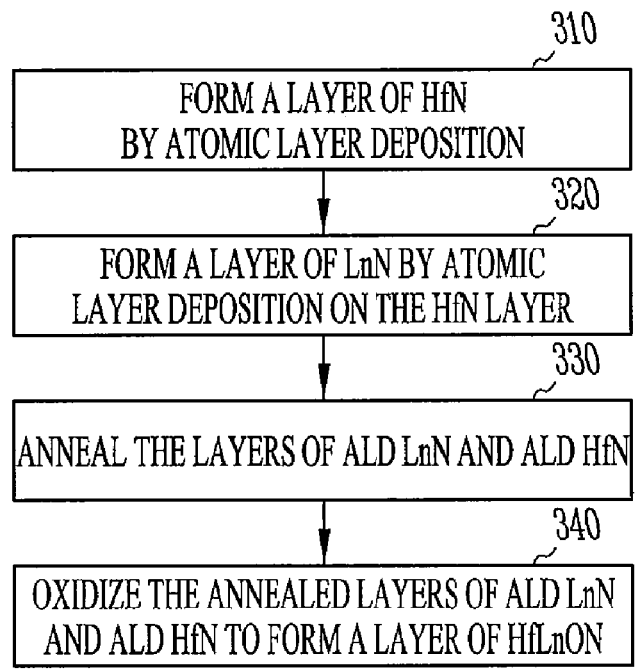
FIG. 3 shows a flow diagram of features of an embodiment for forming a hafnium lanthanide oxynitride film using atomic layer deposition and oxidation.

FIG. 3 shows a flow diagram of features of an embodiment for forming HfLnON using atomic layer deposition and oxidation. At 310, a layer of HfN is formed by atomic layer deposition. At 320, a layer of LnN is formed by atomic layer deposition on the layer of HfN. HfN and LnN films may be alternately deposited in adjacent layers, in which either nitride layer may be deposited as the starting layer. At 330, the layers of LnN and HfN are annealed. At 340, the annealed layers of LnN and HfN are oxidized to form HfLnON. In an embodiment, the annealing and oxidation may be performed together. The layers of LnN and HfN may be annealed and oxidized by rapid thermal oxidation to form HfLnON.

In an embodiment, ALD HfN may be formed using a number of precursors containing hafnium to provide the hafnium to a substrate for an integrated circuit. To form hafnium nitride by atomic layer deposition, a hafnium-containing precursor is pulsed onto a substrate in an ALD reaction chamber. A number of precursors containing hafnium may be used to provide the hafnium to a substrate for an integrated circuit. The hafnium-containing precursor may be a hafnium halide precursor, such as $HfCl_4$ or $HfI_4$. In addition to halide precursors, the hafnium nitride may be grown by ALD using $Hf[N(CH_3)(C_2H_5)]_4$. In an embodiment, the substrate may be held at a temperature ranging from about 150° C. to about 300° C. Other types of tetrakis(dialkylamino) metal compounds may also be used, such as hafnium tetrakis dimethylamine, $Hf[N(CH_3)_2]_4$, or hafnium tetrakis diethylamine, $Hf[N(C_2H_5)_2]_4$, as a hafnium-containing precursor. In various embodiments, after pulsing the hafnium-containing precursor and purging the reaction chamber of excess precursor and by-products from pulsing the precursor, a reactant precursor may be pulsed into the reaction chamber. The reactant precursor may be a nitrogen reactant precursor including, but not limited to, ammonia ($NH_3$). Other nitrogen reactant precursors that may be used include nitrogen-containing compositions that do not include oxygen. In various embodiments, use of the individual hafnium-containing precursors is not limited to the temperature ranges of the above embodiments. Further, forming hafnium nitride by atomic layer deposition is not limited to the abovementioned precursors. In addition, the pulsing of the hafnium precursor may use a pulsing period that provides uniform coverage of a monolayer on the surface or may use a pulsing period that provides partial coverage of a monolayer on the surface during a hafnium sequence.

In an embodiment, ALD LaN may be formed using a number of precursors containing lanthanum to provide the lanthanum to a substrate for an integrated circuit. Such lanthanum-containing precursors include, but are not limited to, $La(thd)_3$, tris (2,2,6,6-tetramethyl-3,5-heptanedionato)lanthanum (III) tetraglyme adduct, $La(EtCp)_3$, and $La(DPM)_3$. In an embodiment using a $La(thd)_3$ precursor, the substrate may be maintained at a temperature ranging from 180° C. to about 425° C. In an embodiment, $H_2$ may be pulsed along with the $La(EtCp)_3$ precursor or the precursor to reduce carbon contamination in the deposited film. After pulsing the lanthanum-containing precursor and purging the reaction chamber of excess precursor and by-products from pulsing the precursor, a reactant precursor may be pulsed into the reaction chamber. To form LaN, a nitrogen reactant precursor is pulsed. A number of precursors containing nitrogen may be used to provide nitrogen. Such nitrogen-containing precursors include, but are not limited to, nitrogen, ammonia ($NH_3$), tert-butylamine ($C_4H_{11}N$), allylamine ($C_3H_7N$), 1,1-dimethylhydrazine (($CH_3)_2NNH_2$). In an embodiment, the substrate is maintained at a temperature ranging from about 400° C. to about 500° C. using tert-butylamine or allylamine as a nitrogen precursor. In an embodiment, $NH_3$ may be pulsed with the tert-butylamine and the allylamine. The addition of $NH_3$ may enhance the deposition rate at lower temperatures. In various embodiments, use of the individual lanthanum-containing precursors is not limited to the temperature ranges of the above example embodiments. Further, forming lanthanum nitride by atomic layer deposition is not limited to the abovementioned precursors. In addition, the pulsing of the lanthanum precursor may use a pulsing period that provides uniform coverage of a monolayer on the surface or may use a pulsing period that provides partial coverage of a monolayer on the surface during a lanthanum/nitrogen sequence.

In various embodiments, nitrogen may be used as a purging gas and a carrier gas for one or more of the sequences. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

Figure 4:
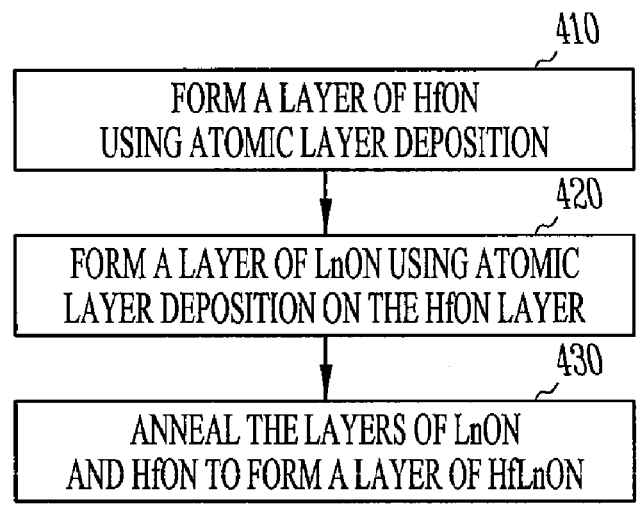
FIG. 4 shows a flow diagram of features of an embodiment for forming hafnium lanthanide oxynitride film using atomic layer deposition and annealing.

FIG. 4 shows a flow diagram of features of an embodiment for forming HfLnON using atomic layer deposition and annealing. At 410, a layer of HfON is formed using atomic layer deposition. At 420, a layer of LnON is formed using atomic layer deposition on the layer of HfON. At 430, the layers of HfON and LnON are annealed to form a layer of HfLnON. HfON and LnON films may be alternately deposited in adjacent layers, in which either oxynitride layer may be deposited as the starting layer.

In an embodiment, ALD LaON may be formed using a number of precursors containing lanthanum to provide the lanthanum to a substrate for an integrated circuit. Such lanthanum-containing precursors include, but are not limited to, $La(thd)_3$, tris (2,2,6,6-tetramethyl-3,5-heptanedionato)lanthanum (III) tetraglyme adduct, $La(EtCp)_3$, and $La(DPM)_3$. After pulsing the lanthanum-containing precursor and purging the reaction chamber of excess precursor and by-products from pulsing the precursor, a reactant precursor may be pulsed into the reaction chamber. A nitrogen reactant precursor may be pulsed. A number of precursors containing nitrogen may be used to provide nitrogen. Such nitrogen-containing precursors include, but are not limited to, nitrogen, ammonia ($NH_3$), tert-butylamine ($C_4H_{11}N$), allylamine ($C_3H_7N$), 1,1-dimethylhydrazine (($CH_3)_2NNH_2$). After pulsing the nitrogen-containing precursor and purging the reaction chamber of excess precursor and by-products from pulsing the precursor, an oxygen reactant precursor may be pulsed into the reaction chamber. The oxygen reactant precursor may include, but is not limited to, one or more of water, atomic oxygen, molecular oxygen, ozone, hydrogen peroxide, a water—hydrogen peroxide mixture, alcohol, or nitrous oxide. In various embodiments, the order of pulsing the precursors may vary. In various embodiments, forming lanthanum oxynitride by atomic layer deposition is not limited to the abovementioned precursors. In addition, the pulsing of the precursors may use pulsing periods that provide uniform coverage of a monolayer on the surface or may use pulsing periods that provide partial coverage of a monolayer on the surface during an ALD cycle forming LaON.

In an embodiment, ALD HfON may be formed using a number of precursors containing hafnium to provide the hafnium to a substrate for an integrated circuit. Such hafnium-containing precursors include, but are not limited to, a hafnium halide, such as $HfCl_4$ or $HfI_4$, $Hf[N(CH_3)(C_2H_5)]_4$, hafnium tetrakis dimethylamine, $Hf[N(CH_3)_2]_4$, or hafnium tetrakis diethylamine, $Hf[N(C_2H_5)_2]_4$. In various embodiments, after pulsing the hafnium-containing precursor and purging the reaction chamber of excess precursor and by-products from pulsing the precursor, a nitrogen reactant precursor may be pulsed into the reaction chamber. A number of precursors containing nitrogen may be used to provide nitrogen. In an embodiment, $NH_3$ may be used as the nitrogen-containing precursor. Other nitrogen reactant precursors that may be used include nitrogen-containing compositions that do not include oxygen. In an embodiment, the nitrogen-containing precursor may also include oxygen. After pulsing the nitrogen-containing precursor and purging the reaction chamber of excess precursor and by-products from pulsing the precursor, an oxygen reactant precursor may be pulsed into the reaction chamber. The oxygen reactant precursor may include, but is not limited to, one or more of water, atomic oxygen, molecular oxygen, ozone, hydrogen peroxide, a water—hydrogen peroxide mixture, alcohol, or nitrous oxide. In various embodiments, the order of pulsing the precursors may vary. Further, forming hafnium oxynitride by atomic layer deposition is not limited to the abovementioned precursors. In addition, the pulsing of the precursors may use pulsing periods that provide uniform coverage of a monolayer on the surface or may use pulsing periods that provide partial coverage of a monolayer on the surface during an ALD cycle forming HfON.

In various embodiments, nitrogen may be used as a purging gas and a carrier gas for one or more of the sequences. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

In various embodiments, either before or after forming a HfLnON film, other dielectric layers such as HfO, LnO, HfON, LnON, dielectric nitride layers, dielectric metal silicates, insulating metal oxides, or combinations thereof are formed as part of a dielectric layer or dielectric stack. In an embodiment, these one or more other layers of dielectric material may be provided in stoichiometric form, in non-stoichiometric form, or a combination of stoichiometric dielectric material and non-stoichiometric dielectric material. In an embodiment, depending on the application, a dielectric stack containing a $HfLnON_x$ film includes a silicon oxide layer. In an embodiment, the dielectric layer is formed as a nanolaminate. An embodiment of a nanolaminate includes a layer of a hafnium oxide and a $HfLnON_x$ film, a layer of hafnium oxynitride and a $HfLnON_x$ film, a layer of lanthanide oxide and a $HfLnON_x$ film, a layer of lanthanide oxynitride and a $HfLnON_x$ film, layers of hafnium oxide, lanthanide oxide, hafnium oxynitride, and lanthanide oxynitride along with a $HfLnON_x$ film, or various other combinations. In an embodiment, a dielectric layer is formed substantially as the hafnium lanthanide oxynitride film.

In various embodiments, the structure of an interface between a dielectric layer and a substrate on which it is disposed is controlled to limit the inclusion of silicon oxide, since a silicon oxide layer would reduce the effective dielectric constant of the dielectric layer. In an embodiment, the material composition and properties for an interface layer are dependent on process conditions and the condition of the substrate before forming the dielectric layer. In an embodiment, though the existence of an interface layer may effectively reduce the dielectric constant associated with the dielectric layer and its substrate, the interface layer, such as a silicon oxide interface layer or other composition interface layer, may improve the interface density, fixed charge density, and channel mobility of a device having this interface layer.

In an embodiment, a hafnium lanthanide oxynitride layer is doped with other elements. The doping may be employed to enhance the leakage current characteristics of the dielectric layer containing the HfLnON$_x$ film by providing a disruption or perturbation of the hafnium lanthanide oxynitride structure. In an embodiment, such doping is realized by substituting a sequence of one of these elements for a hafnium sequence, a lanthanide sequence, or various combinations of sequences. The choice for substitution may depend on the form of the hafnium lanthanide oxynitride structure with respect to the relative amounts of hafnium atoms and lanthanide atoms desired in the oxide. In an embodiment, to maintain a substantially hafnium lanthanide oxynitride, the amount of dopants inserted into the oxynitride are limited to a relatively small fraction of the total number of hafnium and lanthanide atoms.

After forming a dielectric having a hafnium lanthanide oxynitride layer, other material may be formed upon the hafnium lanthanide oxynitride layer. In an embodiment, the other material is a conductive material. The conductive material may be used as an electrode. Such electrodes may be used as capacitor electrodes, control gates in transistors, or floating gates in floating gate transistors. In an embodiment, the conductive material is a metal or conductive metal nitride. In an embodiment, the conductive material is a conductive semiconductor material. In an embodiment, the conductive material is formed by ALD processes. In an embodiment, the conductive material is formed by a substitution process. In an embodiment, the conductive material is formed in a self-alignment process.

In various embodiments, a conductive layer may be deposited by atomic layer deposition on a layer of HfLnON or on a dielectric layer containing a layer of HfLnON. A metal layer may be deposited by atomic layer deposition in an ALD cycle having a halide precursor containing the metal to be deposited and a reactant precursor containing hydrogen. Metal layer formation by ALD is not limited to halide precursors and hydrogen reactant precursors. In various embodiments, precursors may be selected to form ALD conductive layers such as aluminum (Al), tungsten (W), molybdenum (Mo), gold (Au), silver (Ag), gold alloy, silver alloy, copper (Cu), platinum (Pt), rhenium (Re), ruthenium (Ru), rhodium (Rh), nickel (Ni), osmium (Os), palladium (Pd), iridium (Ir), cobalt (Co), germanium (Ge), or metallic nitrides such as WN, TiN or TaN. Formation of ALD conductive layers is not limited to the abovementioned materials.

In an example embodiment, a tantalum layer may be formed on a HfLnON film by atomic layer deposition using a tantalum-containing precursor. In an embodiment, a tantalum halide precursor may be used with hydrogen as a reactant precursor. In an embodiment, a TaCl$_5$ precursor may be used with an atomic hydrogen reactant precursor. The atomic hydrogen reactant precursor may be provided using a plasma. In an embodiment, the substrate temperature may be held at a temperature ranging from about 250° C. to about 400° C. The hydrogen reactant precursor reacts at the substrate to remove the halogen, which forms the selected tantalum halide precursor, leaving tantalum on the substrate surface. After pulsing a tantalum-containing precursor and after pulsing its reactant precursor, the reaction chamber may be purged of excess precursor and/or by-products. In various embodiments, use of the individual tantalum-containing precursors is not limited to the temperature ranges of the above example embodiments. Further, forming tantalum by atomic layer deposition is not limited to the abovementioned precursors. In addition, the pulsing of the tantalum precursor may use a pulsing period that provides uniform coverage of a monolayer on the surface or may use a pulsing period that provides partial coverage of a monolayer on the surface. The tantalum layer may be structured as one or more monolayers. The tantalum layer may have a thickness ranging from a monolayer to thousands of angstroms or more.

In an embodiment, a metal nitride layer may be deposited by atomic layer deposition using a precursor containing the metal to be deposited and a reactant precursor containing nitrogen in an ALD cycle. In an example embodiment, a titanium nitride layer may be formed with a HfLnON film by atomic layer deposition using a titanium-containing precursor. A nitrogen-containing precursor may be used as the reactant precursor for the titanium-containing precursor. The titanium-containing precursor and the nitrogen-containing precursor may be selected such that their use does not form a titanium oxide in the layer of titanium nitride being formed. The titanium-containing precursor and the nitrogen-containing precursor may be selected such that these precursors do not include oxygen as an elemental component. In an embodiment, a titanium halide precursor may be used with NH$_3$ as a reactant precursor. In an embodiment, a TiCl$_4$ precursor may be used with a NH$_3$ reactant precursor. In an embodiment, the substrate temperature may be held at a temperature ranging from about 380° C. to about 500° C. In an embodiment, the substrate temperature may be held at a temperature less than 600° C. After pulsing a titanium-containing precursor and after pulsing its reactant precursor, the reaction chamber may be purged of excess precursor and/or by-products. In various embodiments, use of the individual titanium-containing precursors is not limited to the temperature ranges of the above example embodiments. Further, forming titanium nitride by atomic layer deposition is not limited to the abovementioned precursors, but may include precursors containing oxygen. In addition, the pulsing of the titanium precursor may use a pulsing period that provides uniform coverage of a monolayer on the surface or may use a pulsing period that provides partial coverage of a monolayer on the surface. The titanium nitride layer may be structured as one or more monolayers. The titanium nitride layer may have a thickness ranging from a monolayer to thousands of angstroms or more.

Figure 5A:
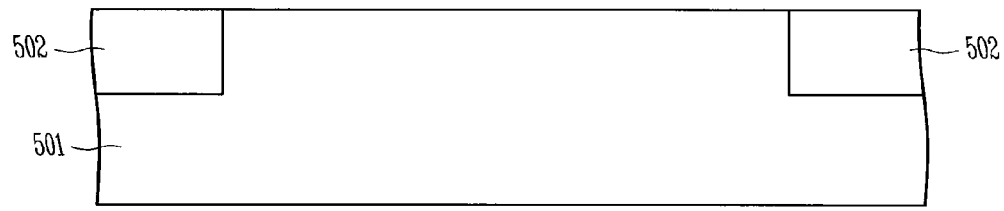
FIGS. 5A-5E illustrate an embodiment of a process for forming a metal substituted electrode.

FIGS. 5A-5E illustrate an embodiment of a process for forming a metal substituted electrode in place of a previously deposited material on a dielectric containing HfLnON. Though a transistor is discussed with reference to FIGS. 5A-5E, such a process may be used with respect to other embodiments of device configurations. FIG. 5A shows a substrate 501 and shallow trench isolation (STI) regions 502. The substrate 501 can be a semiconductor wafer as well as structures having one or more insulative, semi-insulative, conductive, or semiconductive layers and materials. Thus, for example, the substrate can include silicon-on-insulator, silicon-on-sapphire, and other structures upon which semiconductor devices are formed.

Figure 5B:
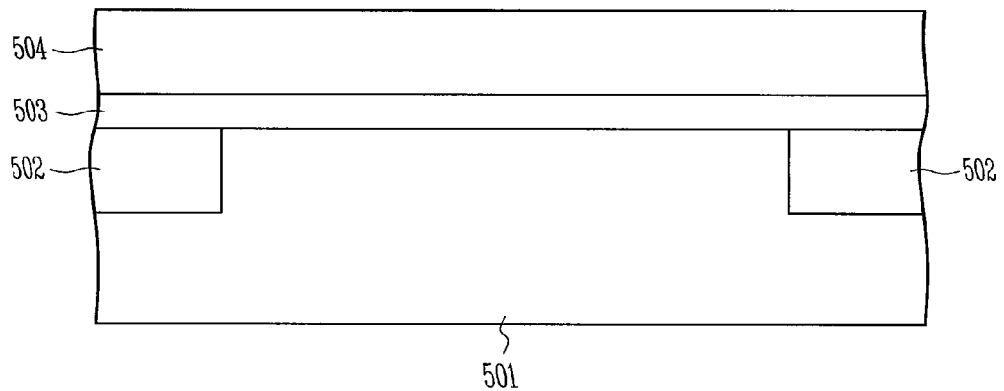

FIG. 5B further shows a gate dielectric layer 503 formed on the substrate 501, and a gate substitutable layer 504 formed on the gate dielectric layer 503. The gate dielectric layer may include a dielectric layer containing HfLnON in addition to other insulative material or a dielectric layer essentially of HfLnON. The use of such a high-κ dielectric increases the capacitance, which is useful for nanoscale integrated circuits. In various embodiments the gate dielectric includes stacked layers comprising one or more high-κ dielectric materials. As described in more detail below, the material of the gate substitutable layer 504 is selected with respect to the desired gate material to allow the gate material to replace the gate substitutable layer. This process forms a gate of the desired gate metal where the substitutable material was positioned on the gate dielectric.

Figure 5C:
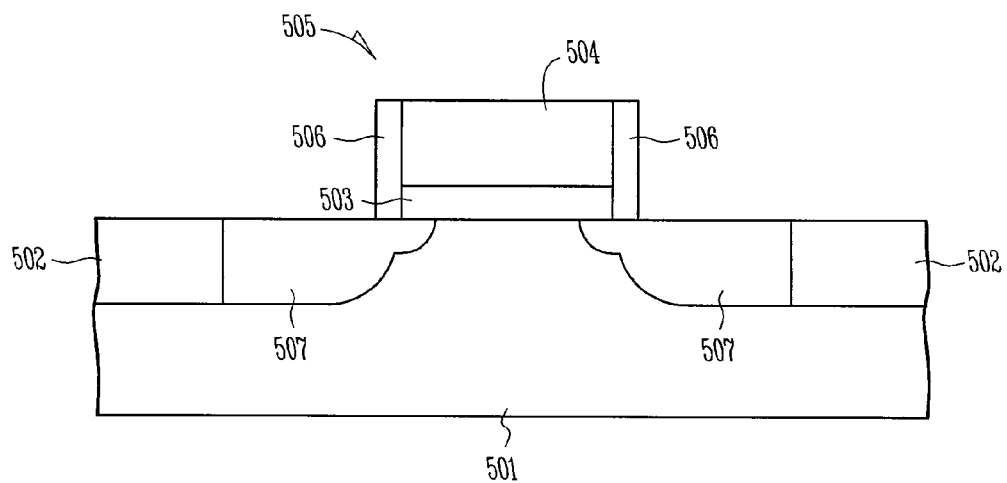

As shown in FIG. 5C, portions of the gate dielectric layer 503 and the gate substitutable layer 504 are removed to define a gate 505. Sidewalls or spacers 506 are formed along the gate 505. Source/drain regions 507 are also formed. Source/drain regions 507 can be formed using conventional ion implantation and subsequent annealing. These annealing temperatures can pose problems for aluminum gates and other metal gates that have melting temperatures less than the anneal temperature for the source/drain regions.

Figure 5D:
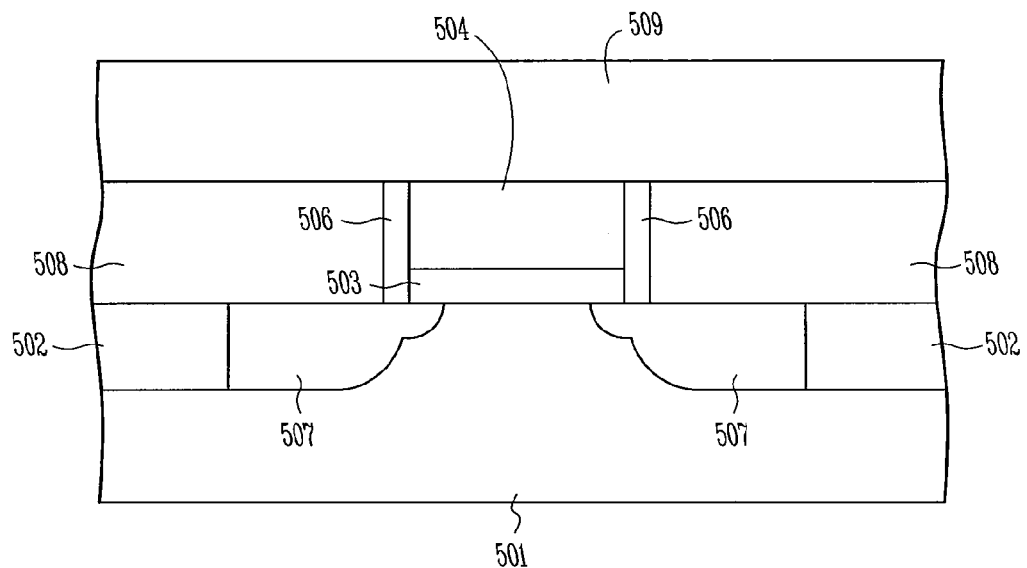

FIG. 5D shows an insulative fill layer 508 provided to match the thickness of the gate stack. A planarization procedure, such as chemical-mechanical polishing, can be used to provide an even surface across the fill layer 508 and the gate substitutable layer 504. A metal layer 509, formed of material intended to be the gate material, is deposited over the gate substitutable layer 504 and the fill layer 508. The metal layer 509 is also referred to herein as a layer of gate material. Various deposition processes, such as evaporation, sputtering, chemical vapor deposition, or atomic layer deposition, may be used to form the metal layer 509. The volume of layer 509 is significantly larger than the volume of the substitutable material left on the wafer.

After the metal layer 509 is deposited on the gate substitutable layer, a metal-substitution reaction is induced. The reaction can be provided by annealing the structure in a non-oxidizing atmosphere such as a nitrogen gas or a forming gas. The heating urges diffusion or dissolution of the intended gate material in metal layer 509 for the substitutable material 504. The substitution process is bounded by the spacers 506 and the gate dielectric 503.

Figure 5E:
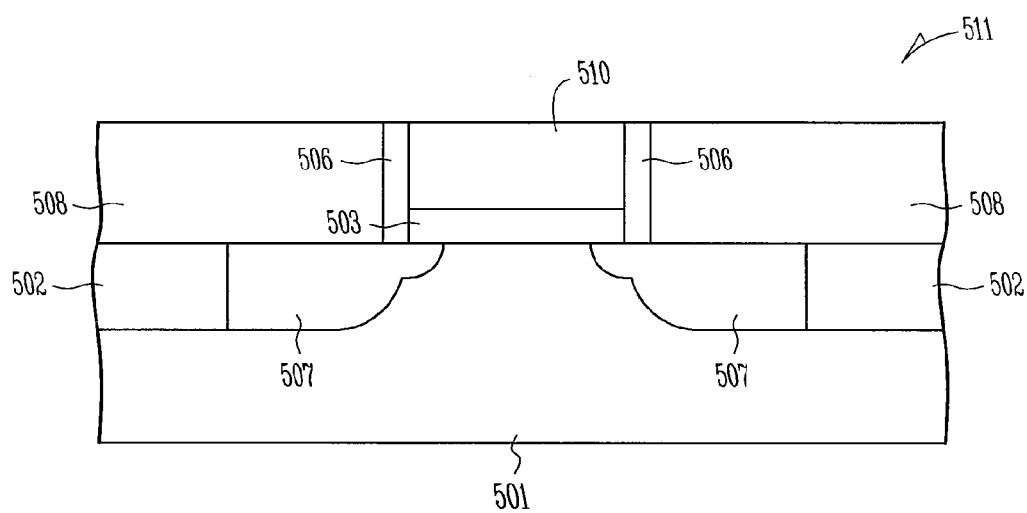

At the conclusion of the substitution reaction, the residual metal of layer 509 and the substitutable material may be removed such as may be achieved using conventional planarization. FIG. 5E shows the resulting low-resistance gate structure. The illustrated structure includes a metal substituted gate 510 formed by the substitution of the metal of layer 509. The metal substituted gate 510 may include a small amount of the gate substitutable material that did not diffuse above the planarization level 511. Such small amounts of the gate substitutable material do not significantly affect the conductivity of the metal substituted gate 510, and thus do not significantly affect the performance of the device.

Drain and source contacts (not shown) can be formed, as well as interconnects to other transistors or components, using conventional techniques. Another heat treatment may occur after packaging the integrated circuit in a protective housing in an attempt to reduce the resistivity of the metal gate contacts and other metal interconnections.

The metal gate substitution technique, as disclosed herein, can be applied to MOS devices, as generally illustrated in FIG. 5E, as well as to form metal floating gates and/or metal control gates in nonvolatile devices. Additionally, various high-κ dielectrics having a HfLnON film can be used between the floating gate and the substrate, and between the control gate and the floating gate in these nonvolatile devices.

Figure 6:
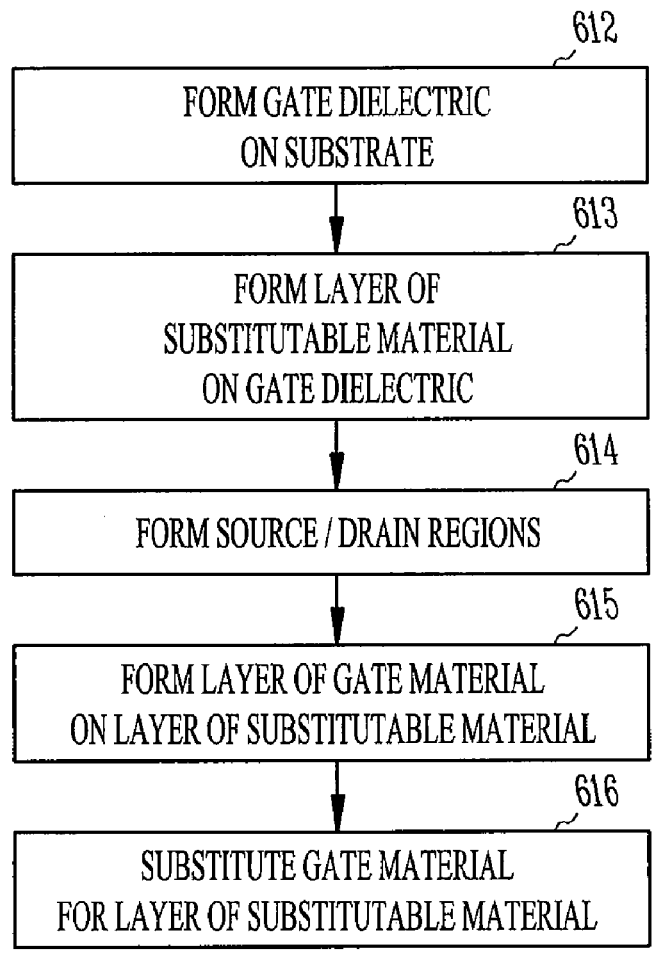
FIG. 6 illustrates a flow diagram of features of an embodiment of a metal substitution technique.

FIG. 6 illustrates a flow diagram of features of an embodiment of a metal substitution technique. At 612, a gate dielectric is formed on a substrate. The gate dielectric includes a HfLnON film. At 613, a layer of gate substitutable material is formed on the gate dielectric. Examples of gate substitutable material include polysilicon, germanium, silicon-germanium, and carbon. At 614, source/drain regions are formed. A layer of gate material is formed at 615 on the gate substitutable material. Examples of such metals include gold, silver, and aluminum. Other metals may be used. At 616, the gate material is substituted for the layer of gate substitutable material.

A metal substitution reaction substitutes or replaces the substitutable material (e.g. silicon, germanium, silicon-germanium, carbon) with a metal. After the substitution, the resulting gate structure includes substantially all of the desired metal. Small amounts of the substitutable material may remain in the gate structure. The substitution reaction can be induced by heating the integrated circuit assembly to a desired temperature in a vacuum, nitrogen, argon, forming gas or other non-oxidizing atmosphere. Heating causes diffusion of the metal layer 609 into the substitutable layer. The annealing temperature for the substitution is less than the eutectic (lowest melting) temperature of materials involved in the substitution for the reaction for substitution to occur. In an embodiment, to form a gold gate, a metal layer may be formed from gold and annealed at approximately 300° C. to substitute the gold for a silicon substitutable structure. In an embodiment, to form a silver gate, a metal layer may be formed from silver and annealed at approximately 500-600° C. to substitute the silver for a silicon substitutable structure. A polysilicon and germanium substitutable material may be used, which reduces the anneal temperature.

According to various embodiments, the gate substitutable material 504 shown in FIGS. 5A-5E includes polysilicon. In some embodiments, the gate substitutable material includes germanium. Some embodiments use silicon-germanium with a percentage of silicon in the range from 0% to 100% as the gate substitutable material 504. Some embodiments use carbon as the gate substitutable material 504. With respect to various embodiments which use polysilicon, germanium, or silicon-germanium as the gate substitutable material 504, a replacement metal for the substituted gate may include aluminium, silver, gold, an alloy of silver, an alloy of gold as the replacement metal, or combinations thereof. In various embodiments, with carbon used as the gate substitutable material 504, a replacement metal for the substituted gate may include gold, silver, an alloy of gold, an alloy of silver, copper, platinum, rhenium, ruthenium, rhodium, nickel, osmium, palladium, iridium, cobalt, germanium, or combinations thereof.

Various embodiments form an integrated circuit structure using two or more substitution reactions. Relatively higher temperature substitution processes can be performed before relatively lower temperature substitution processes. One application for multiple substitution reactions is to independently adjust work functions of NMOS and PMOS transistors in CMOS integrated circuits. Multiple substitution reactions are not limited to this CMOS integrated circuit application. Additional information regarding metal substitution can be found in U.S. patent application Ser. No. 11/176,738 filed Jul. 7, 2005, entitled "METAL-SUBSTITUTED TRANSISTOR GATES," which is herein incorporated by reference.

Figure 7A:
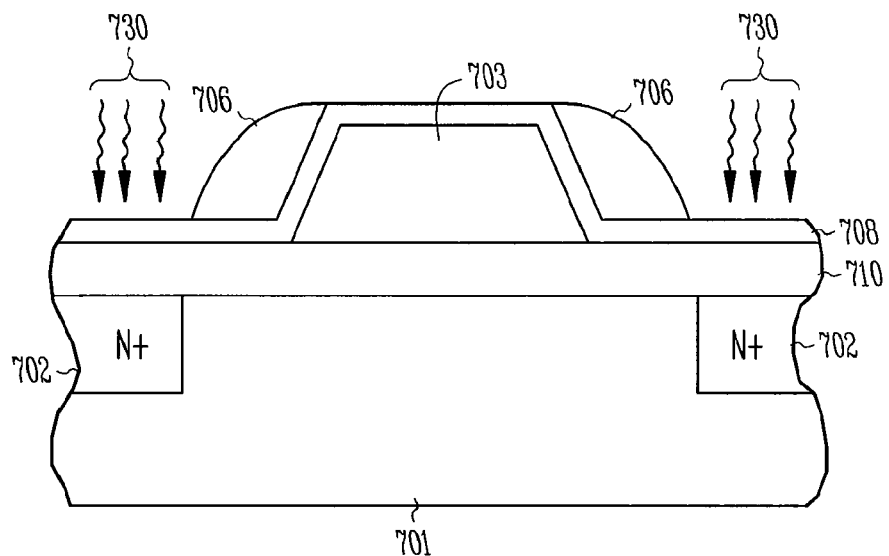
FIGS. 7A-7D illustrate an embodiment of a process for forming a self aligned conductive layer.

FIGS. 7A-7D illustrate an embodiment of a process for forming a self aligned conductive layer such as a metal gate for a transistor structure. FIG. 7A illustrates a high-κ gate dielectric 710 containing HfLnON formed on a substrate 701. The substrate 701 can be a semiconductor wafer as well as structures having one or more insulative, semi-insulative, conductive, or semiconductive layers and materials. Thus, for example, the substrate can include silicon-on-insulator, silicon-on-sapphire, and other structures upon which semiconductor devices are formed.

In FIG. 7A, a sacrificial gate 703 is formed of amorphous carbon on the high-κ gate dielectric 710. In various embodiments, an etch barrier 708 is formed over the sacrificial gate and the dielectric. The etch barrier 708 includes silicon nitride or aluminium oxide, and can be formed using a deposition process, according to various embodiments. Sacrificial sidewall spacers 706 are added adjacent the sacrificial gate 703. In various embodiments, the spacers 706 are formed of amorphous carbon by deposition and conventional direct etch techniques. An ion implantation 730 and high temperature anneal are used to form source/drain regions 702 in areas defined by the sacrificial sidewall spacers 706. These annealing temperatures can pose problems for aluminum gates and other metal gates that have melting temperatures less than the anneal temperature for the source/drain regions.

Figure 7B:
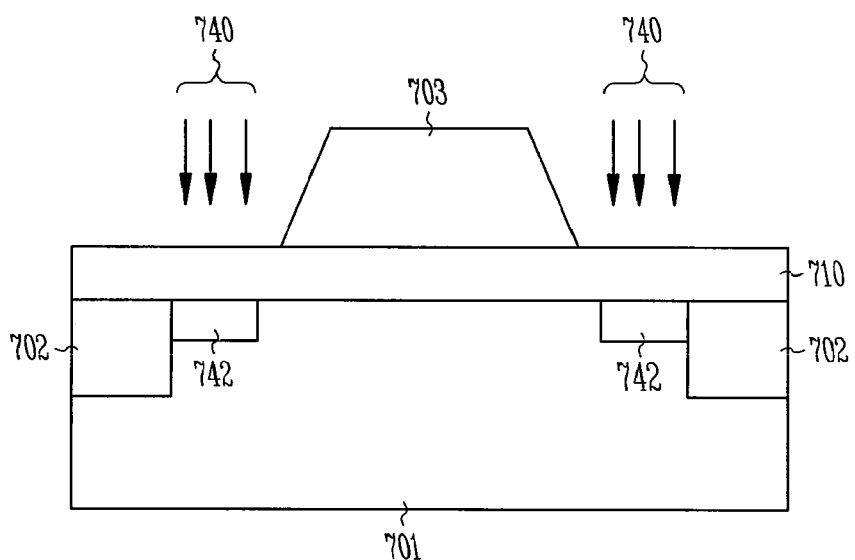

In FIG. 7B, the sacrificial sidewall spacers (706 in FIG. 7A) have been removed. Various embodiments use a plasma oxidation process to remove the sacrificial sidewall spacers. In addition, the etch barrier (708 in FIG. 7A) has been removed. In various embodiments, a light dose ion implantation 740 is used to form source/drain extensions 742 in the substrate 701. The extensions 742 can be annealed at lower temperatures and in shorter times than the more heavily doped source/drain regions 702. According to various embodiments, source/drain extensions for the transistor may be formed with doping the substrate to a depth of 30 nm or less.

Figure 7C:
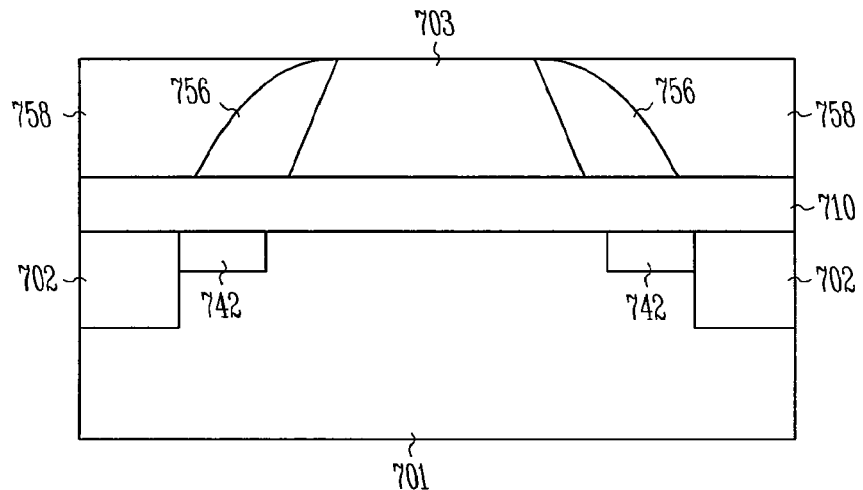

In FIG. 7C, conventional or non-carbon sidewall spacers 756 are formed and the whole structure is back filled with an oxide fill 758, such as silicon dioxide, and planarized. A planarization procedure, such as chemical-mechanical polishing, can be used to provide an even surface. In various embodiments, the conventional sidewall spacers are formed with silicon nitride.

Figure 7D:
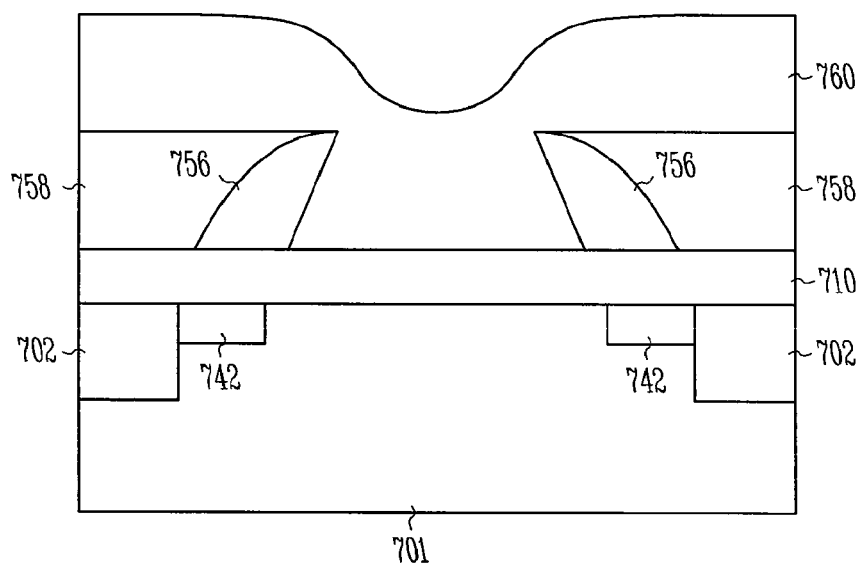

In FIG. 7D, the sacrificial gate (703 in FIG. 7C) is removed and replaced by the deposition of a metal layer 760. In various embodiments, the sacrificial gate is removed using a plasma oxidation process. Various deposition processes, such as evaporation, sputtering, chemical vapor deposition, or atomic layer deposition, may be used to form the metal layer 760. The structure is planarized (not shown) using a planarization procedure, such as chemical-mechanical polishing, resulting in the self aligned metal gate over the high-κ gate dielectric insulator 710. Drain and source contacts (not shown) can be formed, as well as interconnects to other transistors or components, using conventional techniques. Another heat treatment may occur after packaging the integrated circuit in a protective housing in an attempt to reduce the resistivity of the metal gate contacts and other metal interconnections.

FIGS. 7A-7D illustrate two replacement processes for the formation of planar self aligned metal gate transistors, one for disposable sidewall spacers and the other for the gate material itself. The metal gate replacement technique, as disclosed herein, can be applied to MOS devices, as generally illustrated in FIGS. 7A-7D, as well as to form metal floating gates and/or metal control gates in nonvolatile devices. Additionally, various high-κ dielectrics can be used between the floating gate and the substrate, and between the control gate and the floating gate in these nonvolatile devices.

Figure 8:
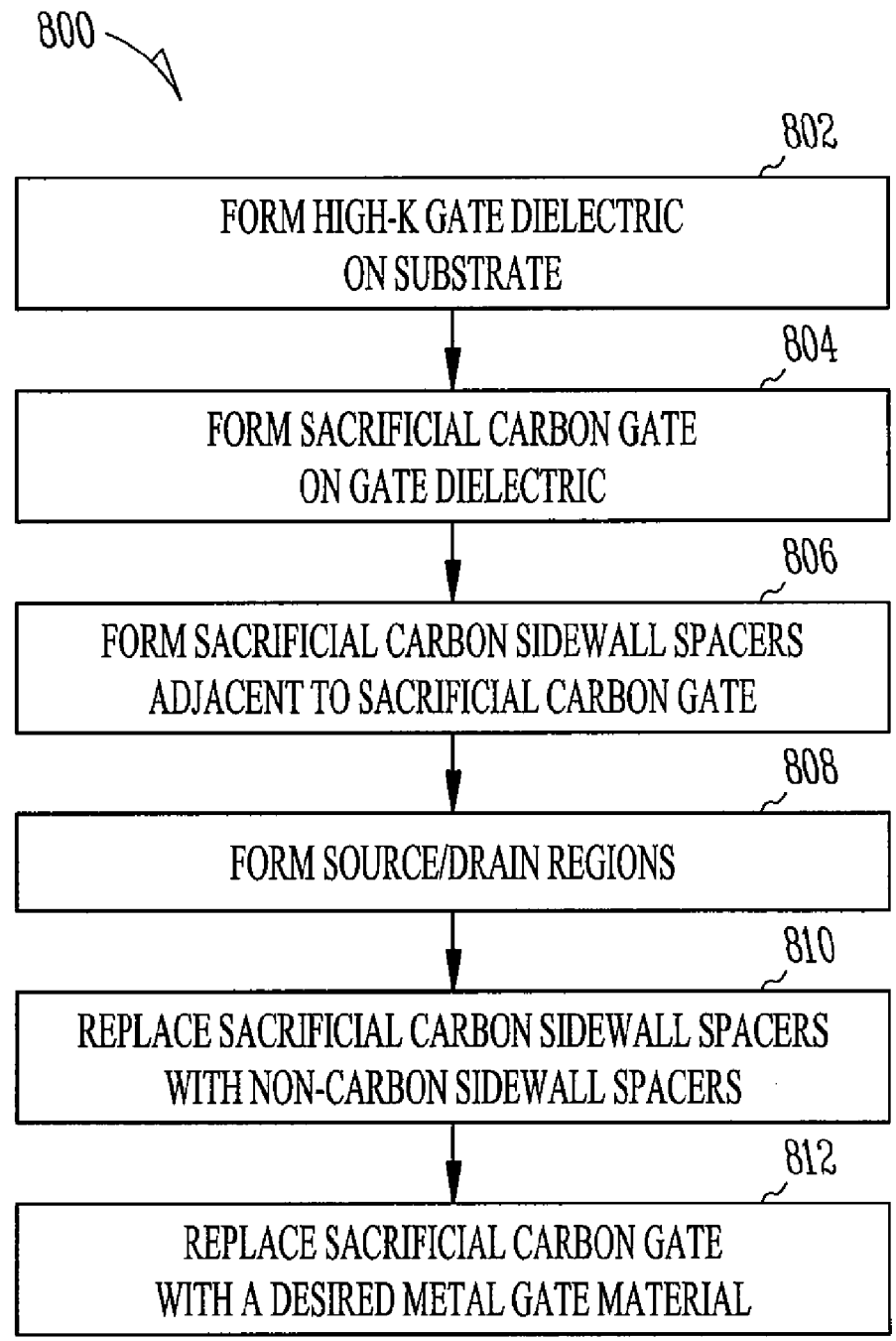
FIG. 8 illustrates an embodiment of a method for forming a self aligned metal gate on high-κ gate dielectrics containing a hafnium lanthanide oxynitride film.

FIG. 8 illustrates an embodiment of a method 800 for forming a self aligned metal gate on high-κ gate dielectrics containing HfLnON. According to various embodiments, a high-κ gate dielectric containing HfLnON is formed on a substrate, at 802. At 804, a sacrificial carbon gate is formed on the gate dielectric. At 806, sacrificial carbon sidewall spacers are formed adjacent to the sacrificial carbon gate. At 808 source/drain regions for the transistor are formed, using the sacrificial carbon sidewall spacers to define the source/drain regions. The sacrificial carbon sidewall spacers are replaced with non-carbon sidewall spacers at 810. At 812, the sacrificial carbon gate is replaced with a desired metal gate material to provide the desired metal gate material on the gate dielectric.

In various embodiments, source/drain extensions may be formed after removing the carbon sidewall spacers and before replacing with non-carbon sidewall spacers. An etch barrier is used in various embodiments to separate the sacrificial carbon gate from the sacrificial carbon sidewall spacers. In various embodiments, the carbon sacrificial gate may be replaced with aluminum (Al), tungsten (W), molybdenum (Mo), gold (Au), silver (Ag), gold alloy, silver alloy, copper (Cu), platinum (Pt), rhenium (Re), ruthenium (Ru), rhodium (Rh), nickel (Ni), osmium (Os), palladium (Pd), iridium (Ir), cobalt (Co), germanium (Ge), or metallic nitrides such as WN, TiN or TaN covered by metals. The high-κ gate dielectric formed at 802 may be one of a number of high-κ gate dielectrics containing HfLnON.

In various embodiments, construction of an integrated circuit structure includes a dielectric containing HfLnON on which is disposed a self-aligned metal electrode. Additional information regarding a self-aligned metal electrode used as a transistor gate can be found in U.S. patent application Ser. No. 11/216,375, filed 31 Aug. 2005, entitled "SELF ALIGNED METAL GATES ON HIGH-K DIELECTRICS," which is herein incorporated by reference.

Figure 9:
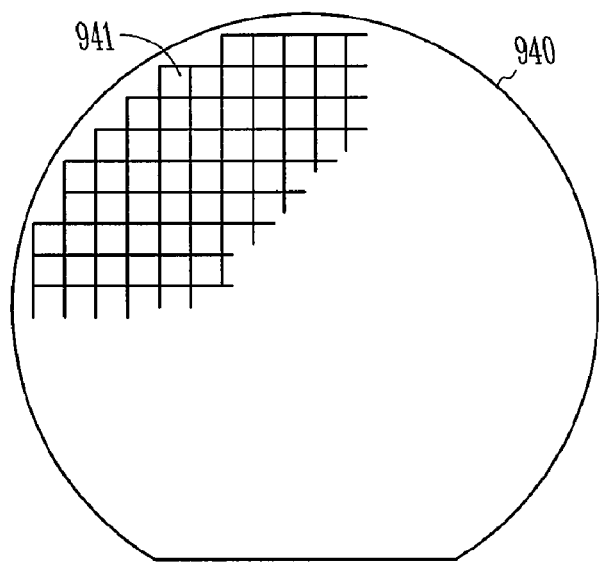
FIG. 9 illustrates a wafer containing integrated circuits having a hafnium lanthanide oxynitride film.

FIG. 9 illustrates an embodiment of a wafer 940 containing integrated circuits having one or more dielectric layers that include a hafnium lanthanide oxynitride film. Conductive electrodes may be disposed on such dielectrics in a number of configurations such as capacitors, transistors, or elements of a memory. The conductive electrodes may be metal electrodes, conductive metal nitride electrodes, and/or conductive metal oxide electrodes. The conductive electrodes may be atomic layer deposited electrodes. Metal electrodes may be metal substituted electrodes and/or self aligned metal electrodes formed in accordance with the teachings of embodiments discussed herein. A common wafer size is 8 inches in diameter. However, wafers are capable of being fabricated in other sizes, and embodiments of wafers containing a hafnium lanthanide oxynitride film are not limited to a particular size. A number of dies can be formed on a wafer. A die 941 is an individual pattern on a substrate that contains circuitry to perform a specific function. A semiconductor wafer typically contains a repeated pattern of such dies containing the same functionality. A die is typically packaged in a protective casing (not shown) with leads extending therefrom (not shown) providing access to the circuitry of the die for communication and control.

Applications containing electronic devices having dielectric layers containing hafnium lanthanide oxynitride film include electronic systems for use in memory modules, device drivers, power modules, communication modems, processor modules, and application-specific modules, which may include multilayer, multichip modules. Such dielectric layers may be configured as multiple layers containing at least one layer of HfLnON or configured substantially as a HfLnON layer. In addition, such dielectric layers may be configured in contact with a metal electrode. Such circuitry can be a subcomponent of a variety of electronic systems, such as a clock, a television, a cell phone, a personal computer, an automobile, an industrial control system, an aircraft, and others.

Figure 10:
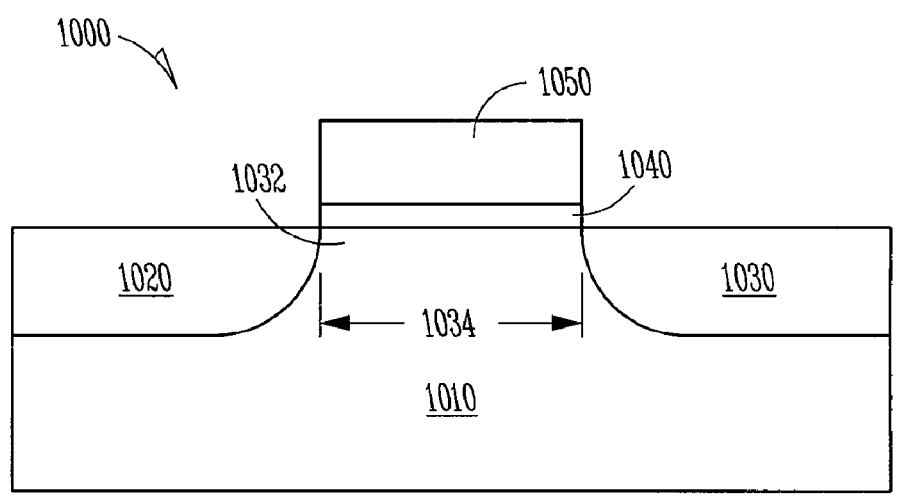
FIG. 10 shows an embodiment of a transistor having a dielectric layer including a hafnium lanthanide oxynitride film.

FIG. 10 shows an embodiment of a transistor 1000 having a dielectric layer 1040 containing a HfLnON$_x$ film. In an embodiment, transistor 1000 includes a source region 1020 and a drain region 1030 in a silicon-based substrate 1010 where source and drain regions 1020, 1030 are separated by a body region 1032. Body region 1032 defines a channel having a channel length 1034. In an embodiment, a gate dielectric 1040 is disposed on substrate 1010 with gate dielectric 1040 formed as a dielectric layer containing HfLnON$_x$. In an embodiment, gate dielectric 1040 is realized as a dielectric layer formed substantially of HfLnON$_x$. In an embodiment, gate dielectric 1040 is constructed as multiple dielectric layers, that is, as a dielectric stack, containing at least one HfLnON$_x$ film and one or more layers of insulating material other than hafnium lanthanide oxynitride film. In an embodiment, the HfLnON$_x$ film is structured as one or more monolayers. An embodiment of a HfLnON$_x$ film is formed using atomic layer deposition. In an embodiment, gate dielectric 1040 may be realized as a gate insulator in a silicon-based structure.

In an embodiment, a gate 1050 is formed on and contacts gate dielectric 1040. In an embodiment, gate 1050 includes conductive material. In an embodiment, gate 1050 includes a conductive material structured as one or more monolayers. In an embodiment, the conductive material layer is an ALD conductive material layer. In an embodiment, the conductive material layer is a substituted metal layer. In an embodiment, the conductive material layer is a self-aligned metal layer. In an embodiment, the thickness of the conductive layer ranges from a monolayer to thousands of angstroms or more.

An interfacial layer may form between body region 1032 and gate dielectric 1040. In an embodiment, an interfacial layer is limited to a relatively small thickness compared to gate dielectric 1040, or to a thickness significantly less than gate dielectric 1040 as to be effectively eliminated. In an embodiment, forming the substrate and the source and drain regions is performed using processes known to those skilled in the art. In an embodiment, the sequencing of the various elements of the process for forming a transistor is conducted with fabrication processes known to those skilled in the art. In an embodiment, transistor 1000 is a MOSFET transistor. In an embodiment, transistor 1000 is a germanium MOSFET structure. In an embodiment, transistor 1000 is a silicon MOSFET structure. In an embodiment, transistor 1000 is a silicon-germanium (SiGe) MOSFET structure. In an embodiment, transistor 1000 is a gallium arsenide MOSFET structure. In an embodiment, transistor 1000 is a NMOS transistor. In an embodiment, transistor 1000 is a PMOS transistor. Transistor 1000 is not limited to the arrangement illustrated in FIG. 10. For example, transistor 1000 may be structured as a vertical transistor. In various embodiments, use of a gate dielectric containing hafnium lanthanide oxynitride is not limited to silicon-based substrates, but is used with a variety of semiconductor substrates.

Figure 11:
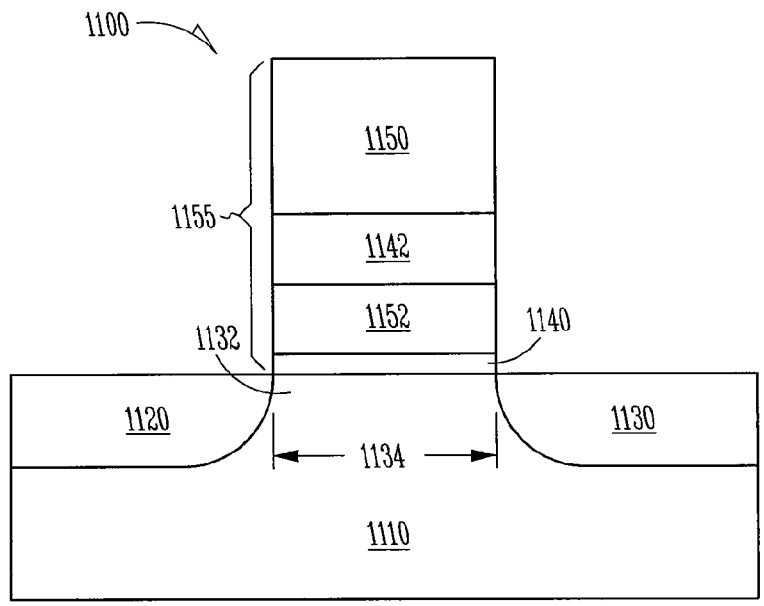
FIG. 11 shows an embodiment of a floating gate transistor having a dielectric layer including a hafnium lanthanide oxynitride film.

FIG. 11 shows an embodiment of a floating gate transistor 1100 having a dielectric layer containing a HfLnON$_x$ film. In an embodiment, the HfLnON$_x$ film is structured as one or more monolayers. In an embodiment, the HfLnON$_x$ film is formed using atomic layer deposition techniques. In an embodiment, transistor 1100 includes a silicon-based substrate 1110 with a source 1120 and a drain 1130 separated by a body region 1132. Body region 1132 between source 1120 and drain 1130 defines a channel region having a channel length 1134. Located above body region 1132 is a stack 1155 including a gate dielectric 1140, a floating gate 1152, a floating gate dielectric 1142 (integrate dielectric 1142), and a control gate 1150. An interfacial layer may form between body region 1132 and gate dielectric 1140. In an embodiment, such an interfacial layer is limited to a relatively small thickness compared to gate dielectric 1140 or to a thickness significantly less than gate dielectric 1140 as to be effectively eliminated.

In an embodiment, gate dielectric 1140 includes a dielectric containing an atomic layer deposited HfLnON$_x$ film formed in embodiments similar to those described herein. In an embodiment, gate dielectric 1140 is realized as a dielectric layer formed substantially of HfLnON$_x$. In an embodiment, gate dielectric 1140 is a dielectric stack containing at least one HfLnON$_x$ film and one or more layers of other insulating materials.

In an embodiment, floating gate 1152 is formed on and contacts gate dielectric 1140. In an embodiment, floating gate 1152 includes conductive material. In an embodiment, floating gate 1152 is structured as one or more monolayers. In an embodiment, floating gate 1152 is an ALD layer. In an embodiment, floating gate 1152 is a substituted metal layer. In an embodiment, floating gate 1152 is a self-aligned metal layer. In an embodiment, the thickness of the floating gate layer ranges from a monolayer to thousands of angstroms or more.

In an embodiment, floating gate dielectric 1142 includes a dielectric containing a HfLnON$_x$ film. In an embodiment, the HfLnON$_x$ film is structured as one or more monolayers. In an embodiment, the HfLnON$_x$ is formed using atomic layer deposition techniques. In an embodiment, floating gate dielectric 1142 is realized as a dielectric layer formed substantially of HfLnON$_x$. In an embodiment, floating gate dielectric 1142 is a dielectric stack containing at least one HfLnON$_x$ film and one or more layers of other insulating materials.

In an embodiment, control gate 1150 is formed on and contacts floating gate dielectric 1142. In an embodiment, control gate 1150 includes conductive material. In an embodiment, control gate 1150 is structured as one or more monolayers. In an embodiment, the control gate 1150 is an ALD layer. In an embodiment, control gate 1150 is a substituted metal layer. In an embodiment, control gate 1150 is a self-aligned metal layer. In an embodiment, the thickness of the control gate layer 1150 ranges from a monolayer to thousands of angstroms or more. In an embodiment, control gate 1150 is structured as one or more monolayers.

In an embodiment, both gate dielectric 1140 and floating gate dielectric 1142 are formed as dielectric layers containing a HfLnON$_x$ film structured as one or more monolayers. In an embodiment, control gate 1150 and floating gate 1152 are formed as conductive layers. In an embodiment, the control gate 1150 and floating gate 1152 are structured as one or more monolayers. In an embodiment, control gate 1150 and floating gate 1152 are ALD layers. In an embodiment, control gate 1150 and floating gate 1152 are substituted metal layers. In an embodiment, control gate 1150 and floating gate 1152 are self-aligned metal layers. In an embodiment, gate dielectric 1140, floating gate dielectric 1142, control gate 1150, and floating gate 1152 are realized by embodiments similar to those described herein, with the remaining elements of the transistor 1100 formed using processes known to those skilled in the art. In an embodiment, gate dielectric 1140 forms a tunnel gate insulator and floating gate dielectric 1142 forms an inter-gate insulator in flash memory devices, where gate dielectric 1140 and floating gate dielectric 1142 may include an hafnium lanthanide oxynitride film structured as one or more monolayers. Floating gate transistor 1100 is not limited to the arrangement illustrated in FIG. 11. For example, floating gate transistor 1100 may be structured as a vertical transistor. Such structures are not limited to silicon-based substrates, but may be used with a variety of semiconductor substrates, such as for but not limited to germanium floating gate transistors, SiGe floating gate transistors, and gallium arsenide floating gate transistors.

Figure 12:
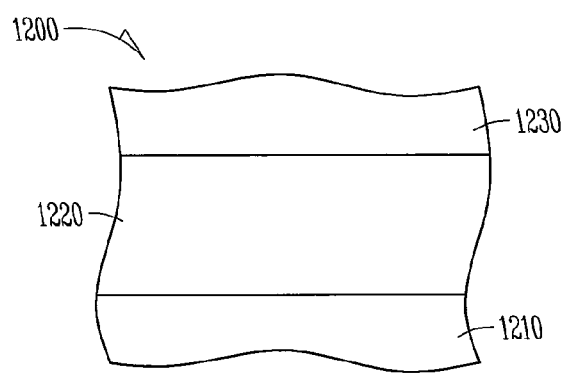
FIG. 12 shows an embodiment of a capacitor having a dielectric layer including a hafnium lanthanide oxynitride film.

FIG. 12 shows an embodiment of a capacitor 1200 having a dielectric layer containing a hafnium lanthanide oxynitride film 1220 and having an electrode 1230. Embodiments of a hafnium lanthanum oxynitride film 1220 structured as one or more monolayers may also be applied to capacitors in various integrated circuits, memory devices, and electronic systems. In an embodiment for a capacitor 1200 illustrated in FIG. 12, a method includes forming a first conductive layer 1210, forming a dielectric layer 1220 containing a hafnium lanthanide oxynitride film structured as one or more monolayers on first conductive layer 1210, and forming a second conductive layer 1230 on dielectric layer 1220. In various embodiments, second conductive layer 1230, first conductive layer 1210, or both second and first conductive layers 1230, 1210 are ALD conductive material layers, substituted metal layers, self-aligned metal layers, or a combination thereof. In an embodiment, the thickness of the conductive layer ranges from a monolayer to thousands of angstroms or more.

In an embodiment, dielectric layer 1220, containing a HfLnON$_x$ film, and conductive layers 1210, 1220 are formed using various embodiments described herein. In an embodiment, dielectric layer 1220 is realized as a dielectric layer formed substantially of HfLnON$_x$. In an embodiment, dielectric layer 1220 is a dielectric stack containing at least one HfLnON$_x$ film and one or more layers of other insulating materials. Embodiments for a hafnium lanthanide oxynitride film may include, but are not limited to, a capacitor in a DRAM and capacitors in analog, radio frequency (RF), and mixed signal integrated circuits. Mixed signal integrated circuits are integrated circuits that may operate with digital and analog signals.

Figure 13:
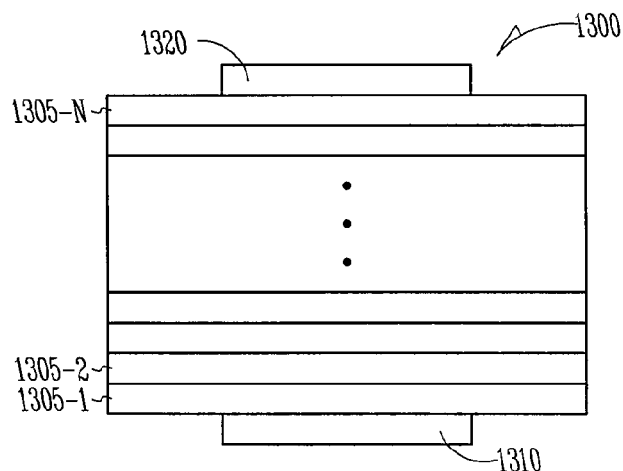
FIG. 13 depicts an embodiment of a dielectric layer having multiple layers including a hafnium lanthanide oxynitride layer.

FIG. 13 depicts an embodiment of a dielectric structure 1300 having multiple dielectric layers 1305-1, 1305-2 . . . 1305-N, in which at least one layer is a hafnium lanthanide oxynitride layer. In an embodiment, layers 1310 and 1320 provide means to contact dielectric layers 1305-1, 1305-2 . . . 1305-N. In an embodiment, each layer 1310, 1320 or both layers are conductive layers. In an embodiment, layers 1310 and 1320 are electrodes forming a capacitor. In an embodiment, layer 1310 is a body region of a transistor with layer 1320 being a gate. In an embodiment, layer 1310 is a floating gate electrode with layer 1320 being a control gate.

In an embodiment, dielectric structure 1300 includes one or more layers 1305-1, 1305-2 . . . 1305-N as dielectric layers other than a HfLnON layer, where at least one layer is a HfLnON layer. In an embodiment, dielectric layers 1305-1, 1305-2 . . . 1305-N include a HfO layer, a LnO layer, a HfON layer, a LnON layer, or various combinations of these layers. In an embodiment, dielectric layers 1305-1, 1305-2 . . . 1305-N include an insulating metal oxide layer. In an embodiment, dielectric layers 1305-1, 1305-2 . . . 1305-N include an insulating nitride layer. In an embodiment, dielectric layers 1305-1, 1305-2 . . . 1305-N include an insulating oxynitride layer. In an embodiment, dielectric layers 1305-1, 1305-2 . . . 1305-N include an insulating silicate layer.

Various embodiments for a dielectric layer containing a hafnium lanthanide oxynitride film structured as one or more monolayers may provide for enhanced device performance by providing devices with reduced leakage current. Such improvements in leakage current characteristics may be attained by forming one or more layers of a hafnium lanthanide oxynitride in a nanolaminate structure with other metal oxides, non-metal-containing dielectrics, or combinations thereof. The transition from one layer of the nanolaminate to another layer of the nanolaminate provides disruption to a tendency for an ordered structure in the nanolaminate stack. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 20 nanometers. In an embodiment, a HfO/HfLnON nanolaminate contains alternating layers of a HfO and HfLnON. In an embodiment, a HfON/HfLnON nanolaminate contains alternating layers of a HfON and HfLnON. In an embodiment, a LnON/HfLnON nanolaminate contains alternating layers of LnON and HfLnON. In an embodiment, a LnO/HfLnON nanolaminate contains alternating layers of LnO and HfLnON. In an embodiment, a HfO/LnON/LnO/HfON/HfLnON nanolaminate contains various permutations of hafnium oxide layers, lanthanide oxynitride layers, lanthanide oxide layers, hafnium oxynitride layers, and hafnium lanthanide oxynitride layers.

In an embodiment, the sequencing of the layers in dielectric structure 1300 structured as a nanolaminate depends on the application. The effective dielectric constant associated with nanolaminate structure 1300 is that attributable to N capacitors in series, where each capacitor has a thickness defined by the thickness and composition of the corresponding layer. In an embodiment, by selecting each thickness and the composition of each layer, a nanolaminate structure is engineered to have a predetermined dielectric constant. Embodiments for structures such as nanolaminate structure 1300 may be used as nanolaminate dielectrics in flash memory devices as well as other integrated circuits. In an embodiment, a layer of the nanolaminate structure 1300 is used to store charge in a flash memory device. The charge storage layer of a nanolaminate structure 1300 in a flash memory device may be a silicon oxide layer.

In an embodiment, transistors, capacitors, and other devices include dielectric films containing a layer of a hafnium lanthanide oxynitride composition with an electrode. In an embodiment, the hafnium lanthanide oxynitride layer is an atomic layer deposited hafnium lanthanide oxynitride layer. In an embodiment, the electrode is an atomic layer deposited electrode. In an embodiment, the electrode is a substituted metal layer. In an embodiment, the electrode is a self-aligned metal layer. In an embodiment, dielectric films containing a hafnium lanthanide oxynitride layer with an electrode are implemented into memory devices and electronic systems including information handling devices. In various embodiments, information handling devices include wireless systems, telecommunication systems, and computers. In various embodiments, such electronic devices and electronic apparatus are realized as integrated circuits.

Figure 14:
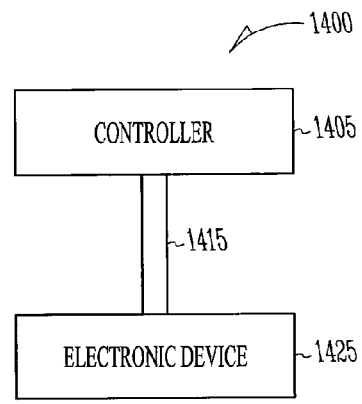
FIG. 14 is a simplified diagram for an embodiment of a controller coupled to an electronic device having a dielectric layer including a hafnium lanthanide oxynitride film.

FIG. 14 illustrates a block diagram for an electronic system 1400 with one or more devices having a dielectric structure including a HfLnON$_x$ film with an electrode. Electronic system 1400 includes a controller 1405, a bus 1415, and an electronic device 1425, where bus 1415 provides electrical conductivity between controller 1405 and electronic device

1425. In various embodiments, controller 1405 includes an embodiment of a HfLnON$_x$ film with an electrode. In various embodiments, electronic device 1425 includes an embodiment of a HfLnON$_x$ film with an electrode. In various embodiments, controller 1405 and electronic device 1425 include embodiments of a HfLnON$_x$ film with an electrode. In an embodiment, electronic system 1400 includes, but is not limited to, fiber optic systems, electro-optic systems, and information handling systems such as wireless systems, telecommunication systems, and computers.

Figure 15:
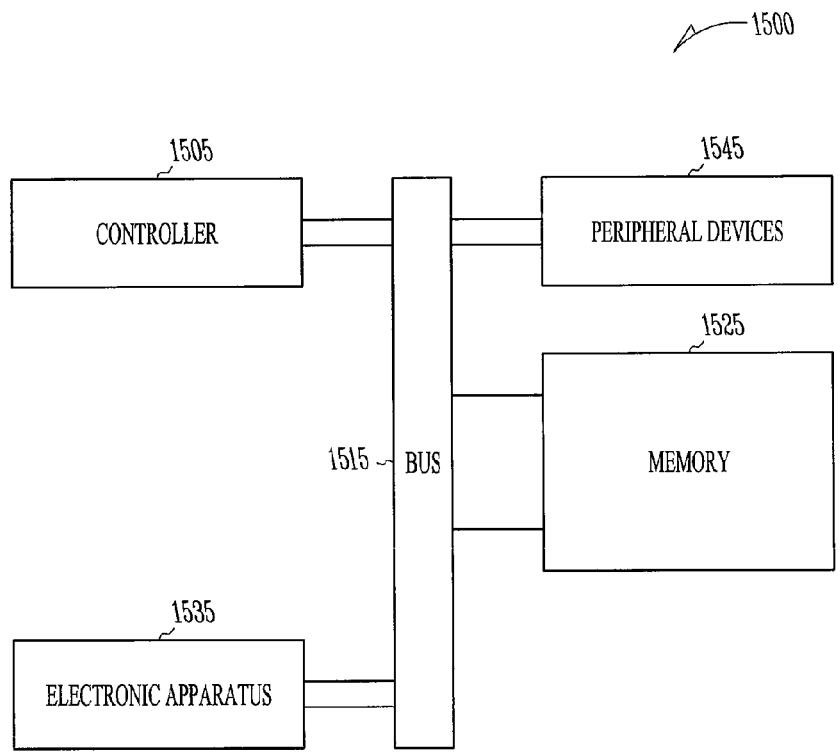
FIG. 15 illustrates a diagram for an embodiment of an electronic system including devices with a dielectric film including a hafnium lanthanide oxynitride film.

FIG. 15 depicts a diagram of an embodiment of a system 1500 having a controller 1505 and a memory 1525. In an embodiment, controller 1505 includes a HfLnON film with an electrode. In an embodiment, memory 1525 includes a HfLnON film structured as one or more monolayers with an electrode. In an embodiment, controller 1505 and memory 1525 each include a HfLnON film with an electrode. In an embodiment, system 1500 also includes an electronic apparatus 1535 and a bus 1515, where bus 1515 provides electrical conductivity between controller 1505 and electronic apparatus 1535 and between controller 1505 and memory 1525. In an embodiment, bus 1515 includes an address bus, a data bus, and a control bus, each independently configured. In an alternative embodiment, bus 1515 uses common conductive lines for providing one or more of address, data, or control, the use of which is regulated by controller 1505. In an embodiment, electronic apparatus 1535 is additional memory configured in a manner similar to memory 1525. In an embodiment, additional peripheral device or devices 1545 are coupled to bus 1515. In an embodiment, peripheral devices 1545 include displays, additional storage memory, or other control devices that may operate in conjunction with controller 1505. In an alternative embodiment, peripheral devices 1545 may include displays, additional storage memory, or other control devices that may operate in conjunction with memory 1525, or controller 1505 and memory 1525. In an embodiment, controller 1505 is a processor. In an embodiment, one or more of controller 1505, memory 1525, bus 1515, electronic apparatus 1535, or peripheral devices 1545 include an embodiment of a dielectric layer having a HfLnON film structured as one or more monolayers with an electrode. In an embodiment, system 1500 includes, but is not limited to, information handling devices, telecommunication systems, and computers.

In an embodiment, memory 1525 is realized as a memory device containing a HfLnON film structured as one or more monolayers with an electrode. In an embodiment, a HfLnON structure with a conductive layer is formed in a memory cell of a memory array. In an embodiment, such a structure is formed in a capacitor in a memory cell of a memory array. In an embodiment, such a structure is formed in a transistor in a memory cell of a memory array. In an embodiment, it will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description and not of limitation.

What is claimed is:

1. A method comprising:
    forming a dielectric including HfLnON, the dielectric formed on a substrate of an electronic device.

2. The method of claim 1, wherein the method includes forming a metal electrode on and contacting the dielectric.

3. The method of claim 2, wherein forming a metal electrode includes forming the metal electrode by substituting a desired metal material for previously disposed substitutable material.

4. The method of claim 2, wherein forming a metal electrode includes forming a self aligned metal electrode on and contacting the dielectric.

5. A method comprising:
    forming a dielectric including HfLnON, wherein forming the HfLnON includes forming an intermediate composition having at least two elements of HfLnON and processing the intermediate composition to form the HfLnON, the forming of the intermediate composition includes using a self-limiting monolayer or partial monolayer sequencing process.

6. The method of claim 5, wherein forming the HfLnON includes forming HfLnO using the self-limiting monolayer or partial monolayer sequencing process and nitridizing the HfLnO to form HfLnON.

7. The method of claim 6, wherein forming HfLnO includes:
    forming hafnium oxide by the self-limiting monolayer or partial monolayer sequencing process;
    forming lanthanide oxide by the self-limiting monolayer or partial monolayer sequencing process; and
    annealing the hafnium oxide with the lanthanide oxide to form HfLnO.

8. The method of claim 5, wherein forming the HfLnON includes:
    forming HfN by the self-limiting monolayer or partial monolayer sequencing process;
    forming LnN by the self-limiting monolayer or partial monolayer sequencing process; and
    oxidizing the HfN and LnN to form HfLnON.

9. The method of claim 5, wherein forming the HfLnON includes:
    forming HfON by the self-limiting monolayer or partial monolayer sequencing process;
    forming LnON by the self-limiting monolayer or partial monolayer sequencing process; and
    annealing the HfON with the LnON to form HfLnON.

10. The method of claim 5, wherein the method includes forming a metal electrode on and contacting the dielectric, the metal electrode formed by forming substitutable material on the dielectric, the substitutable material including one or more materials selected from the group consisting of carbon, polysilicon, germanium, and silicon-germanium, and substituting a desired metal material for the substitutable material to provide the metal electrode on the dielectric.

11. The method of claim 5, wherein the method includes forming a self aligned metal electrode on and contacting the dielectric using a previously disposed sacrificial carbon on the dielectric and sacrificial carbon sidewall spacers adjacent to the sacrificial carbon.

12. A method comprising:
   forming an array of memory cells on a substrate, each memory cell including a dielectric containing HfLnON.

13. The method of claim 12, wherein the method includes forming the HfLnON using a self-limiting monolayer or partial monolayer sequencing process.

14. The method of claim 13, wherein the method includes:
   forming HfLnO by the self-limiting monolayer or partial monolayer sequencing process; and
   nitridizing the HfLnO to form HfLnON.

15. The method of claim 13, wherein the method includes:
   forming HfN by the self-limiting monolayer or partial monolayer sequencing process;
   forming LnN by the self-limiting monolayer or partial monolayer sequencing process;
   annealing the HfN with the LnN; and
   oxidizing the HfN and the LnN to form HfLnON.

16. The method of claim 13, wherein the method includes:
   forming HfON by the self-limiting monolayer or partial monolayer sequencing process;
   forming LnON by the self-limiting monolayer or partial monolayer sequencing process; and
   annealing the HfON with the LnON to form HfLnON.

17. The method of claim 12, wherein the method includes forming a metal electrode on and contacting the dielectric, forming the metal electrode including:
   forming a layer of substitutable material on the dielectric; and
   substituting a desired metal material for the substitutable material to provide the metal electrode on the dielectric.

18. An electronic device comprising:
   a substrate; and
   a dielectric disposed on the substrate, the dielectric containing HfLnON.

19. The electronic device of claim 18, wherein the HfLnON is arranged as a layered structure of one or more monolayers.

20. The electronic device of claim 18, wherein the HfLnON includes HfLaON.

21. The electronic device of claim 18, wherein the dielectric includes dielectric material other than HfLnON.

22. The electronic device of claim 21, wherein the dielectric material includes a metal oxide.

23. The electronic device of claim 18, wherein the dielectric is structured as a nanolaminate.

24. The electronic device of claim 18, wherein the dielectric is disposed in a memory.

* * * * *